US012571623B2

(12) United States Patent
Ahn et al.

(10) Patent No.: US 12,571,623 B2
(45) Date of Patent: Mar. 10, 2026

(54) STRAIN SENSOR-BASED WORKPIECE PROCESSING MONITORING METHOD AND SYSTEM FOR SAME

(71) Applicants: Seoul National University R&DB Foundation, Seoul (KR); Fraunhofer-Gesellschaft zur Förderung der angewandten Forschung e.V., Munich (DE)

(72) Inventors: Sung Hoon Ahn, Seongnam-si (KR); Soohong Min, Seoul (KR); Gilyong Lee, Gumi-si (KR); Tae Hun Lee, Aachen (DE); Sang Wook Lee, Aachen (DE); Daniel Zontar, Aachen (DE)

(73) Assignees: Seoul National University R&DB Foundation, Seoul (KR); Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 272 days.

(21) Appl. No.: 18/003,696

(22) PCT Filed: Jul. 10, 2020

(86) PCT No.: PCT/KR2020/009091
§ 371 (c)(1),
(2) Date: Dec. 29, 2022

(87) PCT Pub. No.: WO2022/004929
PCT Pub. Date: Jan. 6, 2022

(65) Prior Publication Data
US 2023/0314118 A1      Oct. 5, 2023

(30) Foreign Application Priority Data
Jul. 3, 2020      (KR) ......................... 10-2020-0082147

(51) Int. Cl.
G01B 7/00          (2006.01)
B23Q 17/12        (2006.01)
(Continued)

(52) U.S. Cl.
CPC ............... *G01B 7/18* (2013.01); *B23Q 17/12* (2013.01); *G01R 21/001* (2013.01); *G06F 17/14* (2013.01)

(58) Field of Classification Search
None
See application file for complete search history.

(56) References Cited

U.S. PATENT DOCUMENTS

| | | | | |
|---|---|---|---|---|
| 6,134,971 A | * | 10/2000 | Misra ...................... | G01B 7/16 73/777 |
| 2007/0068258 A1 | | 3/2007 | Lee et al. | |
| 2011/0226066 A1 | | 9/2011 | Anand et al. | |

FOREIGN PATENT DOCUMENTS

| | | | | |
|---|---|---|---|---|
| CN | 110238279 A | * | 9/2019 | |
| JP | 2014-184505 A | | 10/2014 | |
| | (Continued) | | | |

OTHER PUBLICATIONS

Min Soo-Hong et al "Directly Printed Low-Cost Nanoparticle Sensor for Vibration Measurement during Milling Process", materials vol. 13, No. 13, Jun. 29, 2020 (Jun. 29, 2020), XP055884995, DOI: 10. 3390/ma13132920 (Year: 2020).*
(Continued)

*Primary Examiner* — Eric S. McCall
*Assistant Examiner* — Nigel H Plumb
(74) *Attorney, Agent, or Firm* — DALY, CROWLEY, MOFFORD & DURKEE LLP

(57) ABSTRACT
Strain sensors are attached to a workpiece, and resistance values of the strain sensors are measured with time while cutting the workpiece with a milling cutting machine. A
(Continued)

power spectrum in a frequency domain is obtained by Fourier-transforming the resistance values measured with time. A power peak is found in the power spectrum to be outputted as a magnitude of vibration occurring during machining the workpiece. By attaching a strain sensor to a stamper of a plastic working machine, a resistance value of the strain sensor is measured while pressing a workpiece on a die with the stamper. A magnitude of the strain corresponding to the measured resistance value is used to obtain a corresponding plastic working force. By attaching the strain sensor directly to the workpiece, it is possible to monitor the state of the plastic working and/or cutting process of the workpiece with high precision at low cost.

21 Claims, 18 Drawing Sheets

(51) Int. Cl.

| | | |
|---|---|---|
| *G01B 7/16* | (2006.01) | |
| *G01R 21/00* | (2006.01) | |
| *G06F 17/14* | (2006.01) | |

(56) References Cited

FOREIGN PATENT DOCUMENTS

| JP | WO 2013-073436 A1 | 4/2015 |
|---|---|---|
| JP | 2018-008367 A | 1/2018 |
| KR | 10-1165231 B1 | 7/2012 |
| KR | 10-1814793 B1 | 1/2018 |

OTHER PUBLICATIONS

Min Soo-Hong et al "Direct printing of highly sensitive, stretchable, and durable strains sensor based on silver nanoparticles/multi-walled carbon nanotubes composites", composities part B, vol. 161, Dec. 30, 2018 (Dec. 30, 2018) (Year: 2018).*

Min et al., "Directly Printed Low-Cost Nanoparticle Sensor for Vibration Measurement during Milling Process;" Article in *Materials*, vol. 13, Issue 13; Jun. 29, 2020; 12 Pages.

International Search Report (with English Translation) dated Mar. 19, 2021 for International Application No. PCT/KR2020/009091; 6 Pages.

Min et al., "Direct Printing of Highly Sensitive, Stretchable, and Durable Strain Sensor Based on Silver Nanoparticles/Multi-Walled Carbon Nanotubes Composites;" Article from Composites Part B, vol. 161; Available Online Dec. 30, 2018; pp. 395-401; 7 Pages.

Min et al., "Directly Printed Low-Cost Nanoparticle Sensor for Vibration Measurement During Milling Process;" Article from Materials, vol. 13; Published Jun. 29, 2020; 12 Pages.

Extended European Search Report dated Nov. 8, 2023 for European Application No. 20943007.3; 8 Pages.

* cited by examiner

<BEFORE DEFORMATION >

<AFTER DEFORMATION>

Figure 18:
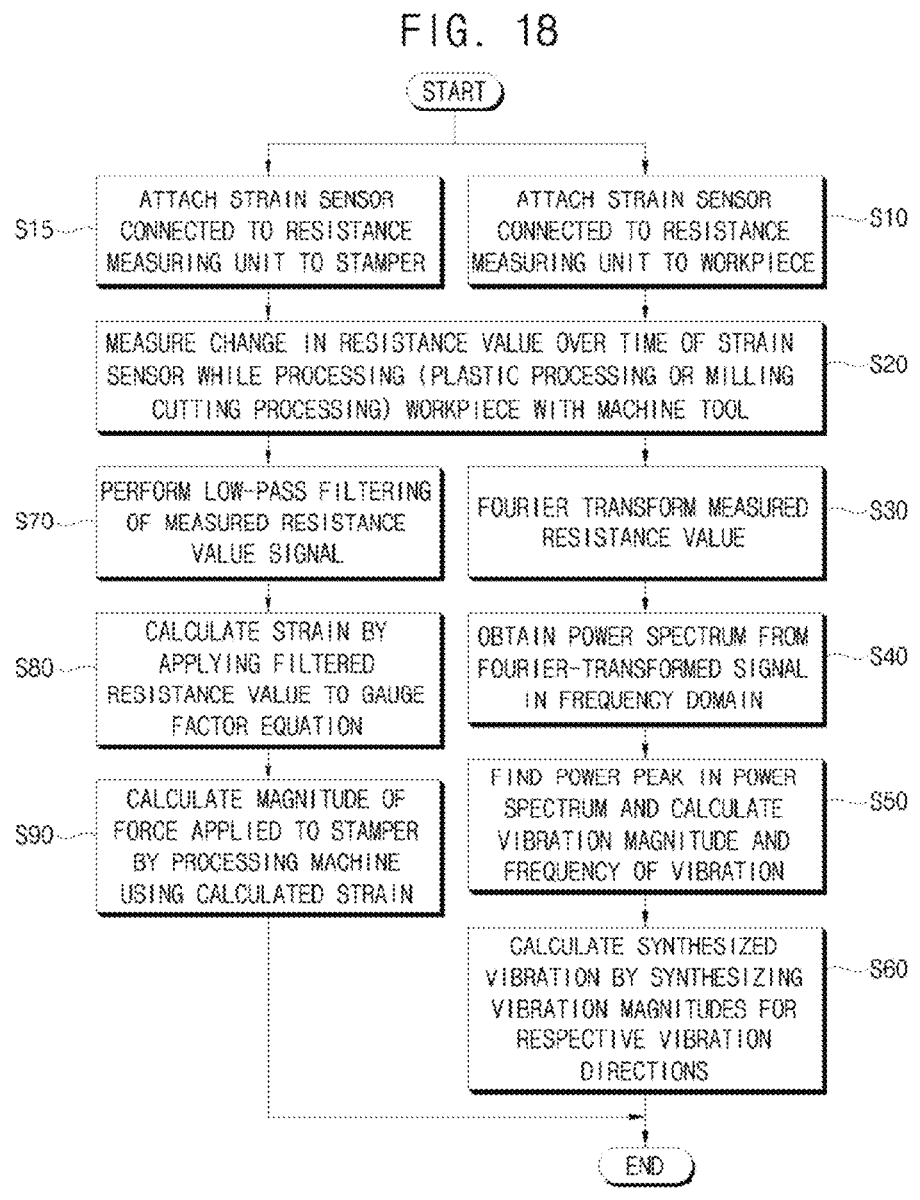

START

ATTACH STRAIN SENSOR CONNECTED TO RESISTANCE MEASURING UNIT TO STAMPER —— S15

ATTACH STRAIN SENSOR CONNECTED TO RESISTANCE MEASURING UNIT TO WORKPIECE —— S10

MEASURE CHANGE IN RESISTANCE VALUE OVER TIME OF STRAIN SENSOR WHILE PROCESSING (PLASTIC PROCESSING OR MILLING CUTTING PROCESSING) WORKPIECE WITH MACHINE TOOL —— S20

PERFORM LOW-PASS FILTERING OF MEASURED RESISTANCE VALUE SIGNAL —— S70

FOURIER TRANSFORM MEASURED RESISTANCE VALUE —— S30

CALCULATE STRAIN BY APPLYING FILTERED RESISTANCE VALUE TO GAUGE FACTOR EQUATION —— S80

OBTAIN POWER SPECTRUM FROM FOURIER-TRANSFORMED SIGNAL IN FREQUENCY DOMAIN —— S40

CALCULATE MAGNITUDE OF FORCE APPLIED TO STAMPER BY PROCESSING MACHINE USING CALCULATED STRAIN —— S90

FIND POWER PEAK IN POWER SPECTRUM AND CALCULATE VIBRATION MAGNITUDE AND FREQUENCY OF VIBRATION —— S50

CALCULATE SYNTHESIZED VIBRATION BY SYNTHESIZING VIBRATION MAGNITUDES FOR RESPECTIVE VIBRATION DIRECTIONS —— S60

END

1

STRAIN SENSOR-BASED WORKPIECE PROCESSING MONITORING METHOD AND SYSTEM FOR SAME

BACKGROUND

Technical Field

The present invention relates to a technology field to monitor processing a workpiece using a strain sensor, and more particularly, to a technology for monitoring the processing state of a workpiece by measuring strain and vibration generated when processing the workpiece using the strain sensor.

Background Art

Industry 4.0 and smart manufacturing trends are increasing the demand for digitized and automated manufacturing processes in many high-tech sectors, including the aerospace and automotive industries. In particular, machining is one of the most potential processes with automation in terms of process time and cost in industry. Therefore, several efforts have been made to automatically optimize the machining process line that requires monitoring of each process. A fundamental and decisive element of intelligent machining operations in this regard is accurate and reliable real-time process monitoring.

In general, cutting forces, machining vibrations, tool wear and surface integrity are the main targets for monitoring machining processes. Indirect measurement methods using acoustic emissions and power consumption are also proposed for monitoring the machining process. However, these approaches typically require expensive sensors and data acquisition systems, making them difficult to be used in industrial applications and limiting their usefulness in certain processing environments or conditions.

Strain and vibration occur during machining of workpieces. Previously, the strain and vibration were measured according to a completely different mechanism. Strain and vibration have different measurement mechanisms and therefore different measurement equipment. Since equipment for measuring strain and equipment for measuring vibration must be prepared separately, the purchase cost of the measuring equipment is high.

A strain sensor, also called a strain gauge, is a sensor for measuring a change in length, such as the displacement of an object, and is used to detect minute displacement in most cases. The strain sensor, being generally composed of a resistor, is attached to an object to be measured and measures the physical strain of the object to be measured by converting it into an electrical signal. If the resistor for the strain sensor is deformed into a thin and long shape by the deformation of the object to be measured, the resistance value of the resistor increases, and conversely, if it becomes thicker and shorter, the resistance value decreases. Therefore, it is possible to measure the minute deformation of the object to be measured by measuring the change in the resistance value of the resistor of the strain sensor.

For strain sensors, sensitivity and measurable range are important performance indicators. A strain sensor with good sensitivity can accurately measure the degree of deformation of the object to be measured. Depending on the characteristics of the object to be measured, the degree of deformation may be large. In order for the strain sensor to be applied to such an object, the measurable range of the strain sensor also needs to be wide enough to sufficiently cover the deformation range of the object to be measure. It is required to develop a strain sensor that satisfies both of these requirements.

SUMMARY OF THE INVENTION

Technical Object

An object of the present invention is to provide a method and system for monitoring the plastic working and/or cutting process state of the workpiece with high precision at low cost by directly attaching a strain sensor to the workpiece.

Other object of the present invention is to provide a method of using the strain sensor for measuring the magnitude of vibration generated when processing the workpiece with the processing machine by attaching the strain sensor to the workpiece and/or a processing machine.

Further other object of the present invention is to provide a method and a system for measuring strain and vibration generated during machining of the workpiece independently or collectively by directly attaching the strain sensor to the workpiece.

The problem to be solved by the present invention is not limited to the above problems, and can be expanded in various ways without departing from the spirit and scope of the present invention.

Solution for the Technical Object

A strain sensor-based workpiece processing monitoring system according to embodiments for realizing the objects of the present invention may include a strain sensor unit, a resistance measuring unit, a signal processing unit, and an operation processing unit. The strain sensor unit includes one or more first strain sensors attached to a workpiece. The resistance measuring unit is configured to measure a resistance value of each of the one or more first strain sensors. The signal processing unit is configured to obtain a power spectrum in a frequency domain by Fourier transforming the resistance value signal measured by the resistance measuring unit. The operation processing unit is configured to find a power peak in the power spectrum to be provided as a magnitude of vibration generated during machining of the workpiece.

In an exemplary embodiment, the resistance measuring unit may be configured to measure resistance values of the plurality of strain sensors, and the signal processing unit may be configured to perform Fourier transform on each of the plurality of resistance values measured by the resistance measuring unit to obtain a plurality of power spectra in the frequency domain. The operation processing unit may be configured to find the power peak in each of the plurality of power spectra and obtain a corresponding magnitude of vibration in each direction.

In an exemplary embodiment, the strain sensor unit may further include a second strain sensor attached to a stamper mounted on a plastic processing machine, and the resistance measuring unit may be configured to measure a resistance value of the second strain sensor. The signal processing unit may be configured to perform low-pass filtering on a measured resistance value signal and convert the filtered signal into a digital value. The operation processing unit may be configured to calculate a magnitude of strain corresponding to the converted resistance value.

In an exemplary embodiment, the operation processing unit may be configured to calculate the magnitude of strain by applying the converted resistance value to a gauge factor equation, $G_f(\Delta R/R)\varepsilon$, where $G_f$ is a gauge factor value of the strain sensor, and R is an initial resistance value of the strain sensor, ΔR is an amount of change in the resistance value of the strain sensor, and ε is a magnitude of a strain to be obtained.

In an exemplary embodiment, the operation processing unit may be configured to obtain a magnitude of force of the plastic processing machine corresponding to the obtained magnitude of strain.

In an exemplary embodiment, the operation processing unit may be configured to detect the power peak within a frequency range of 100 Hz-2 KHz of the power spectrum.

In an exemplary embodiment, the strain sensor may have a sensitivity that a gauge factor is 10 or more and a vibration measurement rate is 100 Hz or more.

In an exemplary embodiment, the strain sensor may include a flexible adhesive substrate; and a conductive line pattern directly printed on a surface of the substrate with conductive fine particles or a composite nanomaterial mixture in which conductive fine particles and carbon nanotubes are mixed, and wherein the conductive line pattern may be configured to be changed in the resistance value by being deformed according to deformation of the substrate.

In an exemplary embodiment, a mixing ratio of the conductive fine particles and the carbon nanotubes of the conductive line pattern formed of the composite nanomaterial mixture may be in a range of 60% by weight to 40% by weight to 90% by weight to 10% by weight.

A method of monitoring workpiece processing based on strain sensor according to embodiments for realizing the objects of the present invention includes: attaching one or more strain sensors connected to a resistance measuring unit to a workpiece; measuring resistance values of the one or more strain sensors using the resistance measuring unit while machining the workpiece with a machine tool; obtaining a power spectrum in a frequency domain by Fourier transforming a resistance signal measured over time; and detecting a power peak in the power spectrum to be outputted as a magnitude of vibration generated during machining of the workpiece.

In an exemplary embodiment, the power peak may be detected within a frequency range of 100 Hz-2 KHz of the power spectrum.

In an exemplary embodiment, the one or more strain sensors may have a sensitivity that a gauge factor is 10 or more and a vibration measurement rate is 100 Hz or more.

In an exemplary embodiment, each of the one or more strain sensors may be configured to include a conductive line pattern in which nanoparticles are directly printed on a surface of a flexible adhesive substrate, and the conductive line pattern is deformed by deformation of the workpiece during machining the workpiece so that a resistance value of the conductive line is changed.

In an exemplary embodiment, the method may further include attaching a strain sensor connected to the resistance measuring unit to a stamper mounted on a plastic processing machine; measuring a resistance value of the strain sensor using the resistance measuring unit while plastically processing a workpiece by pressing the workpiece placed on a die with the stamper of the plastic processing machine; and calculating a magnitude of strain corresponding to the measured resistance value.

In an exemplary embodiment, the calculating of the magnitude of strain may include performing low-pass filtering on the measured resistance value; and calculating the magnitude of strain by applying the filtered resistance value to a gauge factor equation, $G_f(\Delta R/R)\varepsilon$, where $G_f$ is a gauge factor value of the strain sensor, and R is an initial resistance value of the strain sensor, ΔR is an amount of change in the resistance value of the strain sensor, and E is a magnitude of a strain to be obtained.

In an exemplary embodiment, the method may further include calculating a magnitude of force of the plastic processing machine corresponding to the calculated magnitude of strain.

A strain sensor-based workpiece processing monitoring method according to embodiments for realizing the object of the present invention may include: attaching one or more strain sensors connected to a resistance measuring unit to a workpiece; measuring resistance values of the one or more strain sensors with time while cutting the workpiece using a milling cutting machine; Fourier-transforming the resistance value measured with time for each of the one or more strain sensors into a power spectrum a frequency domain; detecting a power peak in the power spectrum and a frequency band in which the power peak occurs in the power spectrum for each of the one or more strain sensors; and outputting the detected power peak and frequency band as information on the magnitude and frequency of vibration generated in the workpiece during cutting the workpiece.

In an exemplary embodiment, the power peak may be detected within a frequency range of 100 Hz-2 KHz of the power spectrum.

In an exemplary embodiment, the one or more strain sensors may have a sensitivity that a gauge factor is 10 or more and a vibration measurement rate is 100 Hz or more.

The method according to the embodiments for realizing the object of the present invention may be used to measure a magnitude of vibration generated when a workpiece is machined with a machine by attaching a strain sensor having a sensitivity of a gauge factor of 10 or more and a vibration measurement speed of 100 Hz or more to the workpiece and/or the machine.

In an exemplary embodiment, the strain sensor may have a characteristic capable of measuring vibration having a frequency of 100 Hz to 2 KHz.

Effect of Invention

With the advent of the 4th industrial revolution, efforts are being made to enhance the competitiveness of the manufacturing industry through digital innovation in the manufacturing sector. Among them, real-time monitoring of process variables is the most basic stepping stone to bring about innovation in various manufacturing industries such as cost reduction and productivity improvement, and various monitoring methods are being studied. However, since most monitoring methods require installation and cost of additional devices, they have a disadvantage in that they are difficult to utilize in the actual field. In particular, in the case of a machining process, displacement, force, vibration, etc. greatly affect the quality of a workpiece and the lifespan of a machine tool. However, in order to monitor this in real time, there is a burden of additionally installing an expensive measuring device.

The present invention provides a method for monitoring a machining process based on the strain sensor that can be manufactured by directly printing conductive nanoparticles on a substrate. The strain sensor used in the method shows a large change in contact resistance according to mechanical stimulation compared to conventional sensors currently commercialized, so it has high sensitivity. Manufacturing costs are also relatively low. By using this, it is possible to accurately monitor machining process variables such as minute displacement, force, and vibration that occur during cutting and plastic machining at low cost. In addition, conventional methods require the installation of expensive and complex measuring equipment to monitor the machining process, but the strain sensor-based process monitoring method according to the present invention simply attaches the strain sensor to the machine or workpiece. It has the advantage of being able to easily monitor the machining process. In particular, the strain sensor alone can accurately measure displacement or force as well as vibration during the machining process, and thus has excellent efficiency. Because of these advantages, the present invention is expected to reduce the cost of the machining process and improve productivity, and can be used in various parts production industries using machining, such as the machine tool industry and automobile parts.

BRIEF DESCRIPTION OF THE DRAWINGS

FIGS. 4 (a) to (d) show a process of manufacturing a strain sensor through a printing process according to an exemplary embodiment of the present invention and a structure of the strain sensor manufactured in the same way.

FIG. 18 is a flow chart illustrating a method of monitoring strain and/or vibration occurring when machining a workpiece according to an exemplary embodiment of the present invention.

DETAILED DESCRIPTION OF THE EMBODIMENTS

Figure 1:
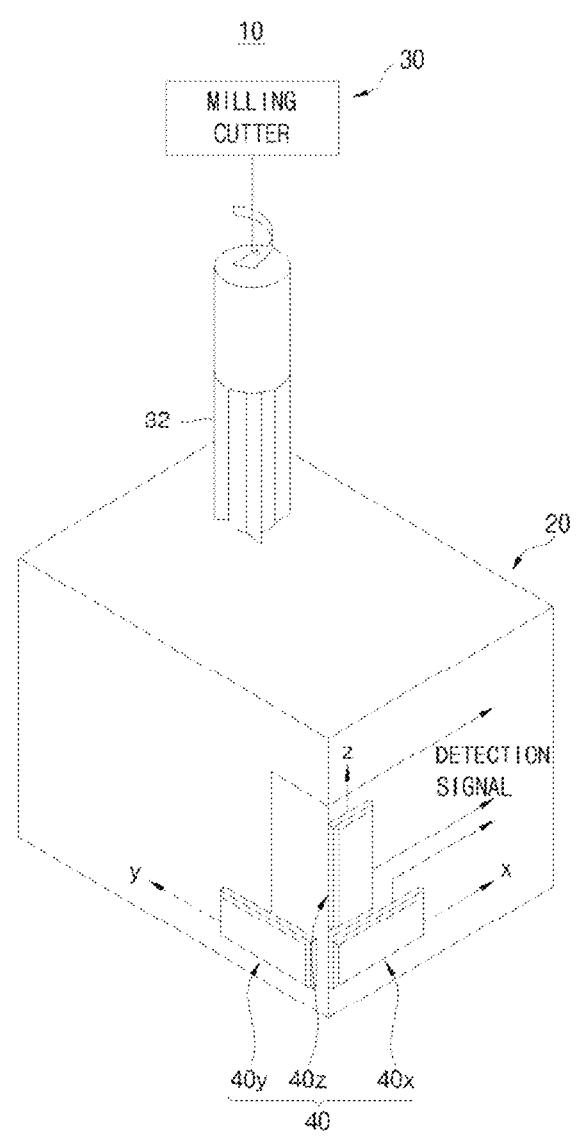
FIG. 1 illustrates monitoring vibration generated when a workpiece is cut with a strain sensor according to an embodiment of the present invention.

Hereinafter, a preferred embodiment of the present invention will be described in more detail with reference to the accompanying drawings. The same reference numerals are used for the same elements in the drawings, and redundant descriptions of the same elements are omitted.

FIG. 1 illustrates a system 10 for monitoring, with a strain sensor 40, vibration generated when a workpiece 20 is cut using a milling cutting machine 30, according to an embodiment of the present invention.

Referring to FIG. 1, illustrated is a state in which the workpiece 20 is cut with the milling cutting machine 30 in a state where strain sensors 40 are attached to the surface of the workpiece 20. A plurality of curved blades divided into a plurality of grooves may be formed on a cutting blade 32 of the milling cutting machine 30. While the blades rotate at high speed, they strike the workpiece 20 to make a hole or cut the side. Vibration occurs in the workpiece 20 due to the impact.

Vibration generated in the workpiece 20 is also transmitted to its surface. The strain sensor 40 may be attached to the surface of the workpiece 20 to detect its vibration. One strain sensor can measure vibration (or strain) in a specific direction. The strain sensor may be attached to each direction of vibration to be measured. If there are a plurality of directions in which vibration is to be measured, the strain sensor needs to be attached to each direction. The direction of the main vibration may vary according to the type of processing of the workpiece. After determining a direction of vibration to be measured, the strain sensor may be attached to that direction.

As illustrated in FIG. 1, three strain sensors 40x, 40y, and 40z may be attached to the surface of the workpiece 20 in a plurality of directions orthogonal to each other, for example, in directions of x, y, and z axes of a Cartesian coordinate system. The three strain sensors 40x, 40y, and 40z may be connected to a monitoring system 100 to be described later. The three strain sensors 40x, 40y, and 40z may detect information corresponding to vibration in the x, y, and z-axis directions generated from the workpiece 20 and provide the detected information to the monitoring system 100. One vibration vector may be obtained by synthesizing the magnitudes of vibrations in three axial directions. As another example, to measure the magnitude of vibration generated on a two-dimensional plane such as the x-y plane, two strain sensors 40x and 40y may be attached to the workpiece 20 in the x-axis and y-axis directions, respectively.

The strain generated in a plastic processing machine during plastic processing of a workpiece may also be measured with a strain sensor. In this regard, FIGS. 2A and 2B show a system 50 for monitoring, with a strain sensor, the amount of strain generated when the workpiece is plastically processed by the plastic processing machine according to an exemplary embodiment, but a state before and a state after a stamper of the plastic processing machine is deformed, respectively.

Figure 2A:
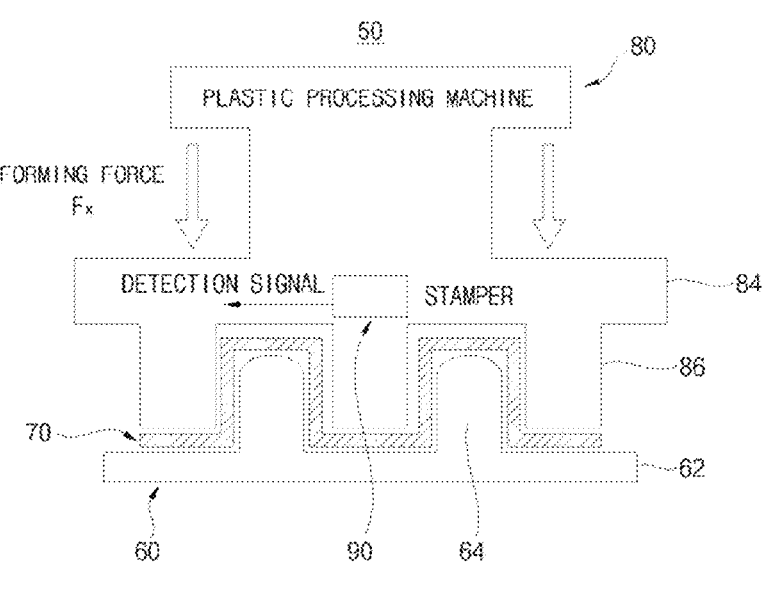
FIGS. 2A and 2B show measuring, with a strain sensor, the magnitude of strain generated when a workpiece is subjected to plastic processing with a plastic processing machine according to an exemplary embodiment of the present invention, respectively showing states before and after a stamper is deformed.
Figure 2B:
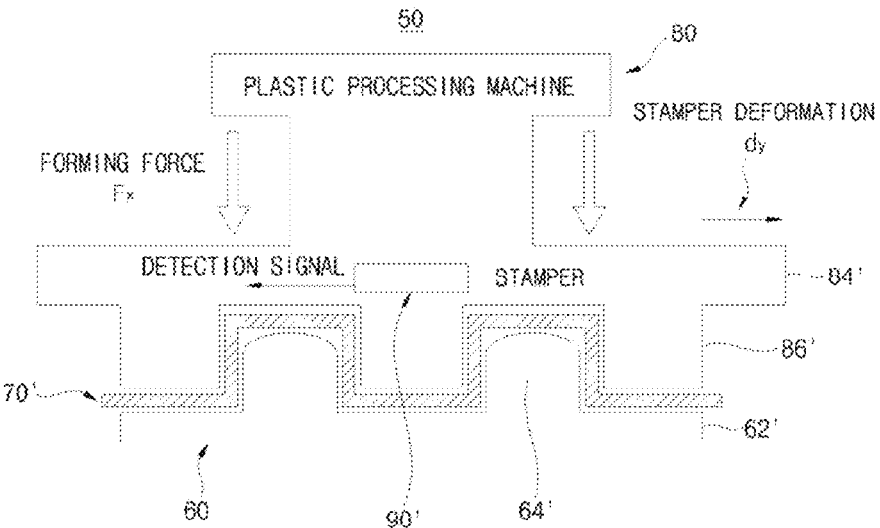

Referring to FIGS. 2A and 2B, a stamper 82 may be mounted on a plastic processing machine 80. The strain sensor 90 may be attached to the surface of the stamper 82, which is a strain measurement target. Specifically, the strain sensor 90 may be attached to measure the deformation of the stamper 82 in a planar direction (a horizontal direction in the drawing). The strain sensor 90 may be connected to the monitoring system 100. A workpiece 70, for example a metal film may be positioned on a die 60 for plastic working. The die 60 may, for example, have a base portion made of metal, and rubber may be applied thereon. The stamper 82 illustrated in the drawing has a shape in which a plurality of protrusions 86 protrude from a stamper substrate 84 in the normal direction, and the die 60 has a shape in which a plurality of protrusions 64 protrude from a die substrate 62 in the normal direction. The stamper 82 and the die 60 are formed with a predetermined pair shape (for example, a concavo-convex shape as shown) on each surface facing each other in this way.

For plastic working, the plastic processing machine 80 may transmit a force Fx generated by a pneumatic machine (not shown) to the stamper 82 to press the workpiece 70 such as metal film placed on the die 60 at high pressure. As shown in FIG. 2A, the workpiece 70 is sandwiched between the die 60 and the stamper 82 at high pressure by the force Fx, and the surface shapes of both the die 60 and the stamper 82 may be deformed into predetermined shapes defined by the surface shapes.

The predetermined processing force Fx may be applied in a direction (a vertical direction in the drawing) normal to the plane of the stamper 82. By the force Fx continuously applied by the plastic processing machine 80, the stamper substrate 84' and the protrusions 86' of the stamper 82' may be deformed to extend in a planar direction (the horizontal direction in the drawing) as shown in FIG. 2B. At this time, the die substrate 62' and the protrusions 64' of the die 60 may be stretched in the planar direction (the horizontal direction in the drawing). According to the magnitude dy of the deformation of the stamper 82 in the plane direction, the strain sensor 90' attached to the side surface of the stamper substrate 84' may also stretch in the plane direction. Due to this deformation, the resistance value of the strain sensor 90' also changes. By measuring the changed resistance value, the degree of deformation of the strain sensor 90' in the plane direction can be obtained.

The amount of deformation of the strain sensor 90 corresponds to the amount of deformation of the stamper 82, and the amount of deformation may be mapped to the force Fx applied to the stamper 82 by the pneumatic machine of the plastic processing machine 80. The monitoring system 100 may monitor the magnitude of the plastic working force Fx applied by the plastic processing machine 80 through the stamper 82 using the change in resistance value of the strain sensor 90.

Figure 3:
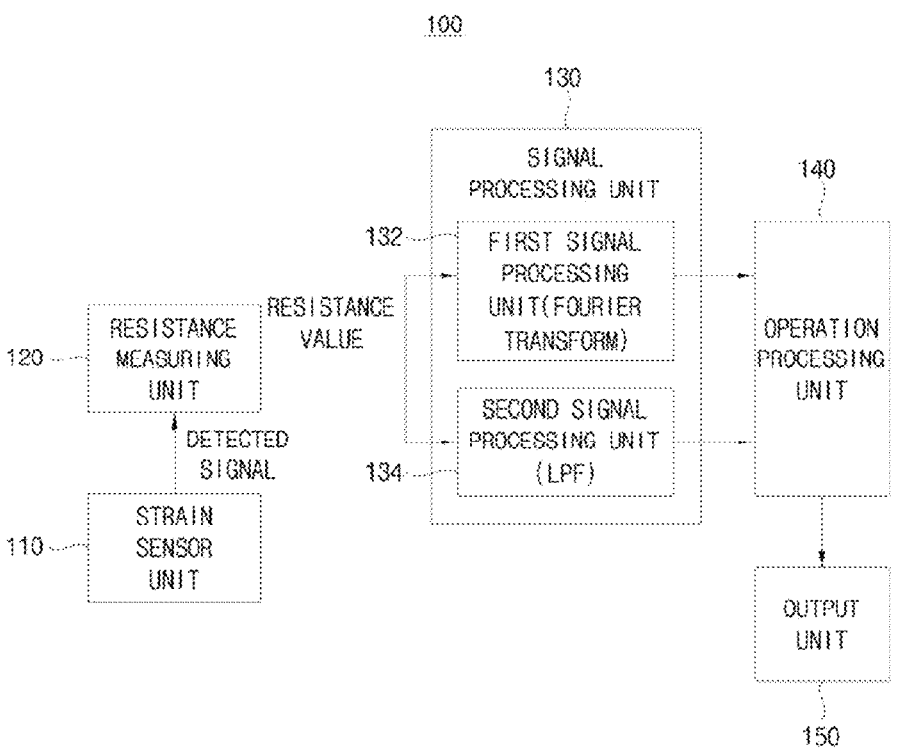
FIG. 3 illustrates a configuration of a system for monitoring strain and/or vibration generated when machining a workpiece according to an embodiment of the present invention.

FIG. 3 illustrates a configuration of the monitoring system 100 for monitoring the amount of strain and/or vibration generated when machining a workpiece according to an exemplary embodiment.

Referring to FIG. 3, the monitoring system 100 may include a strain sensor unit 110, a resistance measuring unit 120, a signal processing unit 130, and an operation processing unit 140.

The strain sensor unit 110 may include the strain sensor 40 attached to the workpiece 20 in order to measure vibration generated in the workpiece during cutting-off or cutting. As mentioned above, if there are multiple directions of vibration to be measured, it is necessary to attach a separate strain sensor for each direction. In this case, the plurality of strain sensors 40x, 40y, and 40z may be attached to be orthogonal to each other. In addition, the strain sensor unit 110 may include a strain sensor 90 attached to the stamper 82 in order to monitor the force applied to the workpiece 70 by the plastic processing machine 80 through the stamper 82 during plastic processing of the workpiece 70.

The resistance measuring unit 120 may be configured to measure the resistance of each strain sensor 40 or 90 of the strain sensor unit 110. Various resistance measurement methods are known, such as, for example, a voltage drop method, a displacement method, a method using a Wheatstone bridge circuit, and a measurement method using a digital multimeter. The resistance measuring unit 120 may be configured based on an appropriate one from known methods. In an exemplary embodiment, since subsequent processing using the measured resistance value is performed digitally, it may be appropriate to configure the resistance measuring unit 120 based on the measurement method using the digital multimeter.

The signal processing unit 130 may include a first signal processing unit 132 for measuring vibration generated in the workpiece during cutting-off processing using resistance value data provided from the resistance measuring unit 120. The first signal processor 132 may be configured to obtain a power spectrum in a frequency domain by performing a Fourier transform on the resistance value data measured by the resistance measuring unit 120. The signal processing unit 130 may further include a second signal processing unit 134 configured to perform low-pass filtering (LPF) processing on the measured resistance value signal and convert the filtered signal into a digital value. The second signal processing unit 134 may remove high-frequency noises included in the resistance value data measured by the resistance measuring unit 120.

The operation processing unit 140 may find a magnitude of a power peak and a frequency band in which the power peak appears from the power spectrum provided by the first signal processing unit 132. The frequency of vibration generated when the blade of a machine tool such as the cutting blade strikes to cut-off or cut a workpiece depends on the type of workpiece (material, structure, etc.), and the type of machine tool such as the cutting blade. The vibration frequency may be included in a frequency range of about 100 Hz to 2 KHz. The strain sensor according to an embodiment of the present invention, as will be described later, may have a conductive line pattern made by printing a mixture of metal nanoparticles and carbon nanotubes on a flexible substrate. The strain sensor may have a characteristic capable of measuring a frequency in a wider range than the vibration frequency of 100 Hz-2 KHz when measuring the vibration frequency generated during processing of a workpiece. Therefore, the vibration generated during the cutting process using the cutting machine can be sufficiently measured using the strain sensor.

Based on such data, the operation processing unit 140 may find a power peak present in a frequency band of 100 Hz-2 KHz in the power spectrum. The power peak found from the frequency band of 100 Hz-2 KHz may be regarded as corresponding to vibration generated in the workpiece 20 due to cutting-off or cutting of the workpiece 20. The operation processing unit 140 may calculate the power peak as a magnitude of the vibration of the workpiece 20. In addition, the operation processing unit 140 may calculate the frequency at which the power peak occurs as the frequency of the vibration.

When the plurality of strain sensors 40x, 40y, and 40z are used, the signal processing unit 130 may provide the power spectrum for each strain sensor to the operation processing unit 140. In this case, the operation processing unit 140 may find power peaks in each of the plurality of power spectra, and obtain magnitudes of vibrations in a direction corresponding to each power peak. Furthermore, the operation processing unit 140 may calculate a synthesized vibration vector generated in the workpiece 20 by synthesizing the obtained magnitudes of vibration in a plurality of directions.

In addition, the operation processing unit 140 may calculate the magnitude of the strain applied to the strain sensor 90 of the strain sensor unit 110 using the resistance value data provided by the second signal processing unit 134. As an example, the operation processing unit 140 may obtain the magnitude of the strain by applying the resistance value data to an equation for gauge factor calculation as shown below.

$$G_f = (\Delta R/R)/\varepsilon \quad \text{[Equation 1]}$$

Here, $G_f$ is a gauge factor value of the strain sensor 90, R is an initial resistance value of the strain sensor 90, $\Delta R$ is an amount of change in the resistance value of the strain sensor 90, and $\varepsilon$ is a distance (i.e., a magnitude of the strain to be obtained) between the nanoparticles forming the conductive line pattern of the strain sensor 90. The gauge factor value $G_f$ of the strain sensor 90 is a unique value for each sensor according to process variables for manufacturing the strain sensor, and may be a known value provided by a sensor manufacturer. The initial resistance value R may also be informed by the manufacturer of the strain sensor. The resistance value change $\Delta R$ of the strain sensor 90 can be known from the resistance value measured by the resistance measuring unit 120 and the initial resistance value of the strain sensor 90.

The magnitude of the strain calculated by the operation processing unit 140 may be regarded as the magnitude of the strain applied to the stamper 82. Through tests, mapping data between the magnitude of strain applied to the stamper 82 and the magnitude of force applied to the stamper 82 by the plastic processing machine 80 may be obtained in advance. The mapping data may be provided by the manufacturer of the plastic processing machine 80. Based on the mapping data, the operation processing unit 140 may obtain the magnitude of the force of the plastic processing machine 80 corresponding to the obtained magnitude of strain.

In an exemplary embodiment, information calculated by the operation processing unit 140, that is, information such as the frequency of vibration generated from the workpiece during cutting and information of the strain generated from the stamper during plastic processing and the force applied by the processing machine, etc., may be output through an output unit 150. The output unit 150 may include, for example, a display device. In another exemplary embodiment, the output unit 150 may include a communication unit for communicating with other remote device.

The operation processing unit 140 may be implemented with software programs for performing these functions, and a processor with a memory device capable of storing and executing the software programs. In an exemplary embodiment, the operation processing unit 140, the signal processing unit 130, and the output unit 150 may be implemented by a computing device such as a personal computer.

In an exemplary embodiment, the operation processing unit 140 and the signal processing unit 130 may be implemented as hardware components, software components, and/or a combination of hardware components and software components. The devices and elements described in the embodiments may include, for example, a processor, a controller, an arithmetic logic unit (ALU), a digital signal processor, a microcomputer, a field programmable array (FPA), and a programmable logic unit (PLU), microprocessor, or one or more general purpose computers or special purpose computers, such as any other device capable of executing and responding instructions. A processing device may run an operating system (OS) and one or more software applications running on the operating system. The processing device may also access, store, manipulate, process, and generate data in response to execution of software. The software may include a computer program, code, instructions, or a combination thereof, which configures a processing device to operate as desired or processes independently or collectively. Software may be distributed on network-connected computer systems and stored or executed in a distributed manner. The software and data may be stored in one or more computer-readable recording media.

Figure 4:
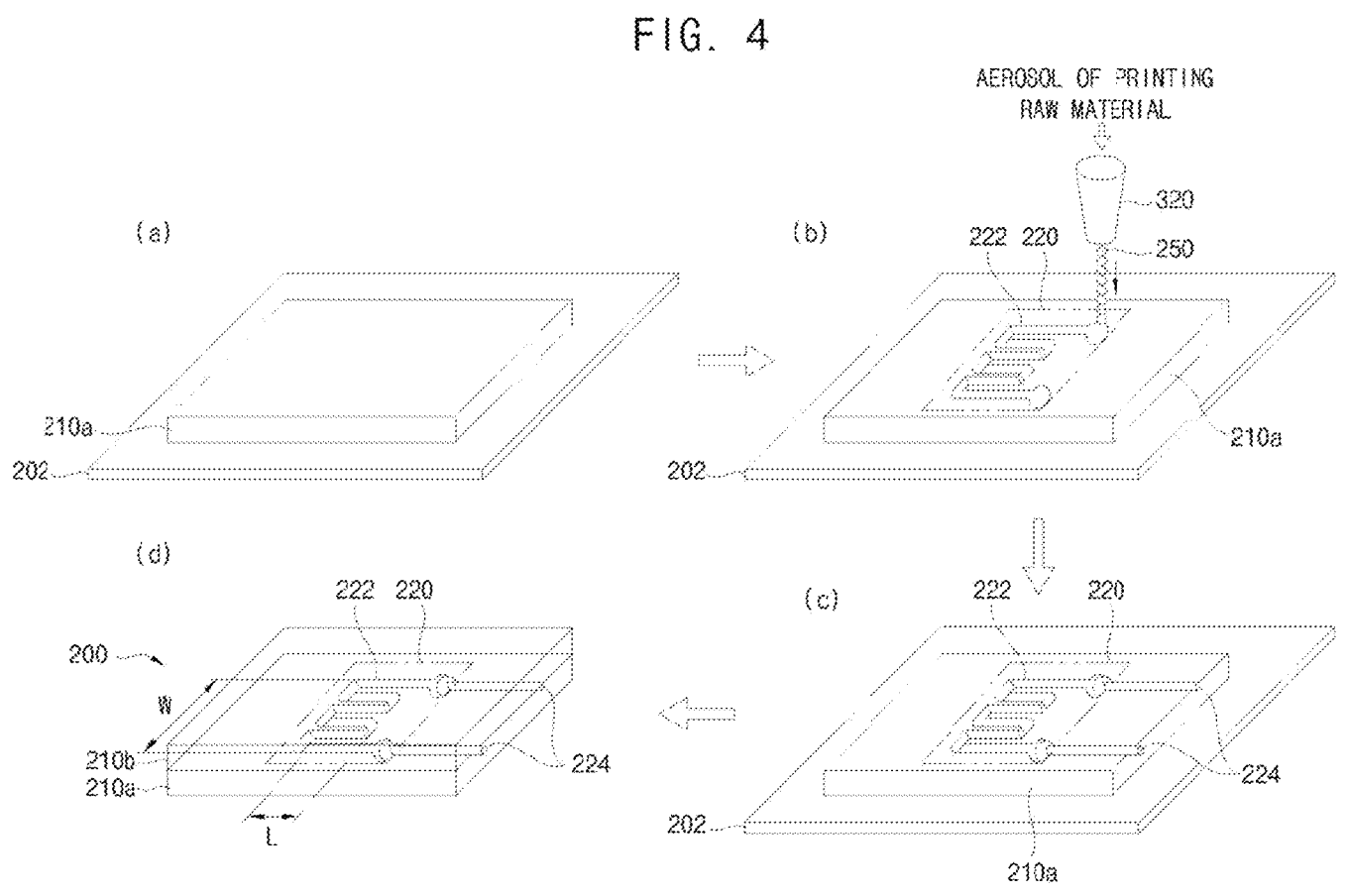

FIG. 4 illustrates a process of fabricating a strain sensor through a printing process and a structure of the fabricated strain sensor according to an exemplary embodiment.

Referring to FIG. 4, in the manufacturing process illustrated, a strain sensor 200 may be manufactured by a method of directly printing a conductive line pattern on the surface of a substrate 210a by aerosolizing a printing raw material 250. To this end, the substrate 210a is first placed on a stage 202 (see FIG. 4 (a)).

Then, a jet nozzle 320 is positioned above the substrate 210a placed on the stage 202, and its outlet faces the surface of the substrate 210a. At least one of the jet nozzle 320 and the stage 202 may be moved so that the jet nozzle 320 moves on the substrate 210a along a desired path (i.e., the shape of a conductive line pattern 220 to be printed). In an exemplary embodiment, the stage 315 may be driven so that the outlet of the jet nozzle 320 moves relative to the substrate 210a along the conductive line pattern 220. During this relative movement, the printing raw material 250 may be sprayed through the outlet of the jet nozzle 320 in an aerosolized state. As a result, the printing raw material 250 may be directly printed in a form deposited on the surface of the substrate 210a. A conductive line 222 can be printed with a desired width and height by adjusting the jet amount of the mixture of the printing raw material 250 and the relative moving speed of the jet nozzle 320 with respect to the substrate 210a. The printing raw material mixture directly printed on the substrate 210a may form the conductive line pattern 220 having the same shape as the path of the relative movement of the jet nozzle 320 with respect to the substrate 210a (see FIG. 4(b)).

As an exemplary embodiment, the substrate 210a may be a flexible substrate having a property of being flexible and stretchable when an external force is applied to itself. The substrate 210a may be made of a material that is soft and not hard, and thus has good elasticity and flexibility. According to an exemplary embodiment, the flexible substrate 210a can be made using the material with a shore hardness of 10 to 70 based on shore A (i.e., hardness classified as extra-soft or soft) or a shore hardness of 22 or less based on shore D. A representative material having such hardness characteristics may be PDMS. For example, a substrate made of PDMS may be cut to a desired size and used as the flexible substrate 210a, which is an object of a printing work.

However, in the case of using a printing raw material composed of only conductive fine particles, a substrate made of polyethylene terephthalate (PET) film or polyimide film, a silicon substrate, substrates made from relatively stiff materials such as carbon fiber reinforced plastics (CFRP) or glass fiber reinforced plastics (GFRP), may be used.

In addition, the lower surface of the substrate 210a may have adhesiveness that can be tightly adhered to the surface of the workpiece 20 or a processing machine such as the stamper 82. To this end, the lower surface of the substrate 210a may be formed of an adhesive layer. In order to measure the vibration of a target object to be measured with simple attachment, it is desirable that the flexible substrate should have high thermal durability and electrical insulation. For example, Kapton polyimide film (DuPont, USA) may be used as the flexible substrate.

As an exemplary embodiment, the printing raw material 250 may include conductive fine particles. The conductive fine particles may be a metal selected from the group including silver, copper, gold, platinum, tin, iron, nickel, aluminum, titanium, and mixtures of at least one or more thereof, ceramics, polymers, or mixtures thereof. Preferably, the conductive fine particles may have a particle size of several nm to several tens of m. Silver nanoparticles having a size of 100 nm or less may be used. Of course, metals that can be used as the conductive fine particles may include other metals in addition to those exemplified above depending on the purpose.

As another exemplary embodiment, the printing raw material 250 may be a composite nanomaterial mixture in which nanotubes are further added to the above-mentioned conductive fine particles. The carbon nanotubes may be single-wall carbon nanotubes (SWCNTs) or multi-wall carbon nanotubes (MWCNTs). MWCNTs may have better bonding with metal nanoparticles than SWCNTs. The mixing ratio of the metal nanoparticles and the carbon nanotubes constituting the printing raw material 250 may be in the range of 60% by weight to 40% by weight to 90% by weight to 10% by weight. If the amount of metal nanoparticles is less than 60% by weight, it may be difficult to obtain a desired level of conductive properties, and if the amount is more than 90% by weight, carbon nanotubes may not be enough and stacking on the substrate 210a may not be effective. Within the range of the mixing ratio, more metal nanoparticles may be included in applications where sensitivity is more important than measurable range, and more carbon nanotubes may be included in applications where measurable range is more important than sensitivity. In particular, the conductive line patterns 220 of the strain sensors 40 and 90 may be formed by jetting a mixture of metal nanoparticles and carbon nanotubes to be printed on a flexible substrate. In the strain sensors 40 and 90 thus manufactured, even when metal nanoparticles are separated from each other due to the strain applied to the conductive line, electrical connection between the carbon nanotubes can be maintained, thereby providing a relatively wide range of strain measurement. When vibration frequency is measured with such a strain sensor, vibration in a very wide frequency band can be measured. The strain sensor manufactured by spraying a mixture of conductive fine particles and carbon nanotubes to be printed on a flexible substrate can also measure higher frequencies than 2 KHz when measuring vibration generated when machining a workpiece with a machining tool such as a cutting blade.

Figure 5:
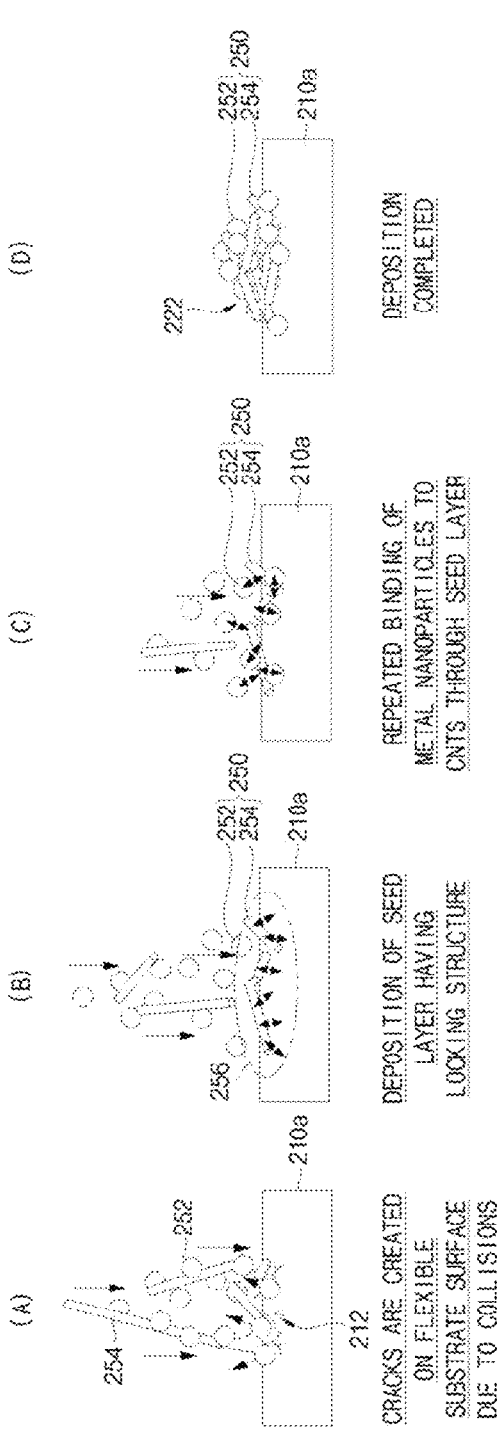
FIGS. 5 (a) to (d) show a process of directly printing a composite nanomaterial mixture on a substrate by a high-pressure jetting method according to an exemplary embodiment of the present invention.

FIG. 5 shows a process in which when a composite nanomaterial mixture obtained by adding carbon nanotubes to conductive fine particles is used as the printing raw material 250 and jetted at high pressure to the substrate 210a, the composite nanomaterial mixture is directly printed on the substrate 210a.

Further referring to FIG. 5, the mixture of the printing raw material 250 jetted at high pressure through the jet nozzle 320 in an aerosol state collides with the surface of the substrate 210a while creating cracks 212 of any shape on the surface of the substrate and thereby permeating into the surface layer (see (A) of FIG. 5). In this process, the metal nanoparticles contribute more to making the cracks 212, and the carbon nanotubes can penetrate into the cracks 212 to form a seed layer 256 mechanically locked with the surface layer of the substrate 210a (see (B) of FIG. 5). The seed layer 256 of the locking structure is repeatedly bonded with metal nanoparticles 252 subsequently sprayed thereon to be deposited on the substrate 210a (see (C) of FIG. 5). The mixture of the printing raw material 250 subsequently colliding on the seed layer 256 can be deposited on the seed layer 256 to form a layer the printing raw material 250 of the metal nanoparticles 252 and carbon nanotubes 254 (see (D) of FIG. 5). The carbon nanotubes 254 and the metal nanoparticles 252 may form the conductive line 222 by being deposited on the surface of the substrate 210a while forming a very strong bond with each other. In this way, the conductive line 222 printed on the substrate 210a can maintain a coupled state with the substrate 210a stably and firmly.

Referring back to FIG. 4, after the direct printing of the conductive line 222 on the surface of the substrate 210a, lead wires 224 may be connected to both ends of the conductive line 222 to extend outside the substrate 210a. A separate strip line conductor may be used as the lead wires 224. Accordingly, the strain sensor 200 may have a basic configuration including the substrate 210a and the conductive line 222 directly printed on the surface of the substrate 210a. (see FIG. 4(c))

The printed strain sensor 200 may be covered with a cover 210b for electrical insulation and mechanical protection from an external environment such as a chip or air pressure generated during a machining process. The cover 210b may be made of an insulating material, and may be made of the same material as the above-mentioned substrate 210b. The cover 210b may be bonded to the substrate 210a while covering the conductive line 222. The conductive line 222 and the lead wires 224 may be stably maintained and protected by being sandwiched between the substrate 210a and the cover 210b (see FIG. 4 (d)).

Figure 6:
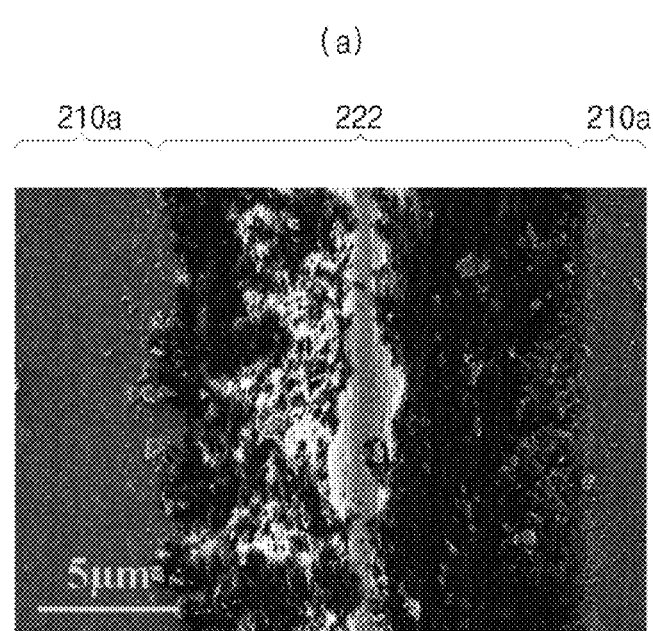
FIGS. 6 (a) and (b) illustrate an image, taken with an electron microscope, of a conductive line formed by directly printing a mixture of silver nanoparticles and multi-walled carbon nanotubes on a polydimethylsiloxane (PDMS) substrate, and a confocal microscope image thereof, respectively.
Figure 6:
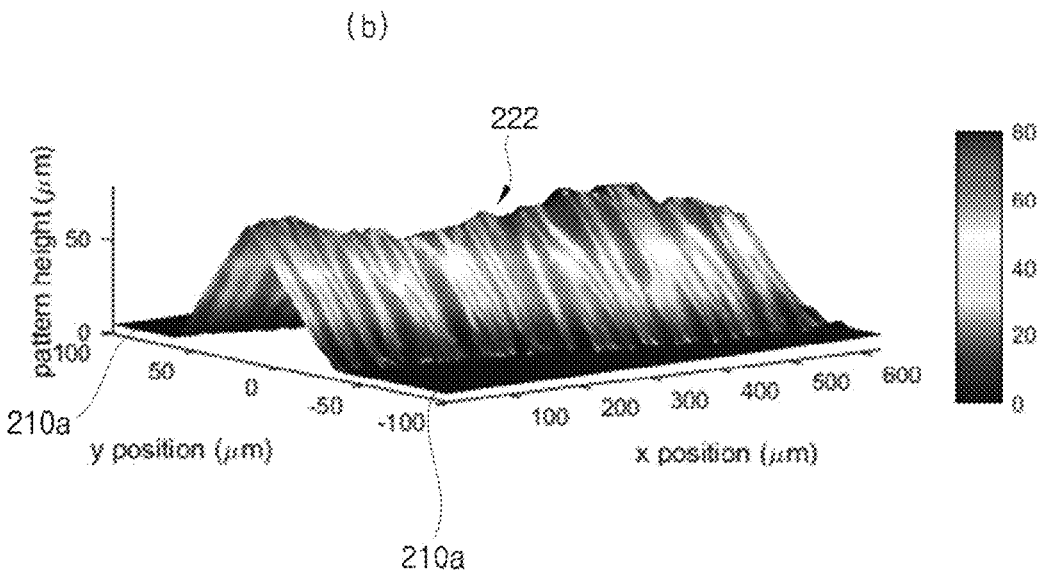

In an exemplary embodiment, (a) and (b) FIG. 6 are a scanning electron microscope image (a) of the conductive line 222 obtained by directly printing a mixture of silver nanoparticles and multi-walled carbon nanotubes on the PDMS substrate 210a, and a confocal microscope image (b), respectively. Looking at the images of (a) and (b) of FIG. 6, it can be seen that the vertical cross-section of the conductive line 222 has a substantially triangular shape, and is firmly printed on the surface of the substrate 210a with a substantially uniform width and height.

In an embodiment, the conductive line pattern 220 may include a plurality of linear conductive lines each having a predetermined length in a first direction and extending linearly. The plurality of linear conductive lines may be arranged side by side in a second direction perpendicular to the first direction to form a series connection while maintaining a constant interval therebetween. That is, the conductive line 222 of the strain sensor 200 may have, for example, a pattern similar to a waveform shape in which rectangular pulse waves are connected by serially connecting long and thin conductive strips in a zigzag pattern in parallel. The resistance value of this conductive line pattern 220 changes according to the degree of deformation by an external force. The conductive line pattern 220 is referred to as a measuring grid, and the length (L) and width (W) of this measuring grid may be set to various sizes depending on the target of application. The shape of the illustrated conductive line pattern 220 is merely exemplary. It goes without saying that the conductive line pattern 220 may be configured in another arbitrary shape such as a straight shape or a wavy shape.

An example of an apparatus for the direct-printing the printing raw material 250 on the substrate 210a by jetting the printing raw material 250 in the form of an aerosol is disclosed in Korean Patent Application Publication No. 10-2015-0074623 (title of the invention: Apparatus and method for conveying, focusing and purging powder for low temperature direct printing). The apparatus and method described in the publication document are intended to be incorporated as part of this invention by way of reference.

Briefly explaining the operating mechanism of the printing apparatus, a pressure unit and the purging unit may be connected to a container containing the printing raw material through an openable pipe and an outlet of the container may be connected to the jet nozzle 320 through the pipe via a filter. The jet nozzle 320 may be installed in the working chamber. The pressure unit may aerosolize the printing raw material powder using a pressure difference, and the purging unit may return the transported gas mixed with the aerosolized powder to the outside. The pressure unit and the purging unit alternately and repeatedly may perform, for example, an excitation operation for 10 ms and a purging operation for 90 ms with respect to the conductive particles of the printing raw material contained in the container. At this time, a relatively high pressure (e.g., 1000 Pa) and a relatively low pressure (e.g., 400 Pa) may be maintained in a feeder region and a vacuum chamber region in the container, respectively. Due to the pressure difference, an aerodynamic impact may be applied to the conductive particles of the printing raw material, and the printing raw material powder is aerosolized by the aerodynamic impact, and air flows from the feeder region to the chamber region. The aerosolized printing raw material powders may be jetted out at high speed through the jet nozzle 320 via the filter and the connecting pipe. The jet out printing raw material powders are aerodynamically focused on the substrate 210a and mechanically deposited on the substrate 210a through the same mechanism as described in FIG. 5 above. Through this process, conductive nanoparticles may be directly printed on the substrate 210a without chemical etching or heat treatment.

If the strain sensors 40 and 90 used for the present invention are manufactured by the above method and device, they can have high sensitivity and high measurement frequency (rate). A conductive line pattern obtained by direct-printing metal nanoparticles (NPs) or a mixture of them and carbon nanotubes on a substrate may have a porous structure. Due to the porous structure of the conductive fine particles, the strain sensor can have very sensitive resistance characteristics.

In the printed strain sensors 40 and 90, as the substrate 210a is deformed by an external force, the conductive line pattern 220 is also deformed and its resistance value is changed. A resistive sensor based on metal nanoparticles may have high sensitivity due to a rapid change in contact resistance due to mechanical separation between metal nanoparticles produced by mechanical stretching. This can be explained by the electron tunneling effect between adjacent metal nanoparticles. Accordingly, the strain sensors 40 and 90 may have an advantage of exhibiting an ultra-fast electrical resistance response to a high-frequency external stimulus without hysteresis. Because of this sensing mechanism, the strain sensors 40 and 90 based on metal nanoparticles can stably detect high-frequency vibrations. In an exemplary embodiment, the strain sensors 40 and 90 used in the present invention may have a high sensitivity of, for example, a gauge factor of 10 or more, and a high measurement frequency (measurement response frequency of the sensor to an input of a physical quantity (speed) of about 100 Hz or more. These two factors have a trade-off relationship with each other. Depending on the process parameters or the design of the stamper, the sensitivity of the sensor and the magnitude of the measurable frequency may vary.

In the measurable range of strain, the conductive line printed with the mixture of metal nanoparticles and carbon nanotubes may have a wider measurable range than the conductive line printed only with metal nanoparticles. In the conductive line printed only with metal nanoparticles, when the degree of deformation of the object to be measured exceeds a predetermined threshold, the distance between the electrically connected metal nanoparticles widens excessively, and the electrical connection may be cut off. The degree of deformation of the object to be measured cannot be accurately measured. In contrast, in the conductive line printed with the mixture of metal nanoparticles and carbon nanotubes, even when the degree of deformation of the object to be measured exceeds the threshold, the carbon nanotubes connect between the metal nanoparticles with widely spaced gaps. Therefore, since the metal nanoparticles and the carbon nanotubes can remain electrically connected to each other as a whole, the measurable range is relatively broader compared to the case of using only the metal nanoparticles.

Figure 7:
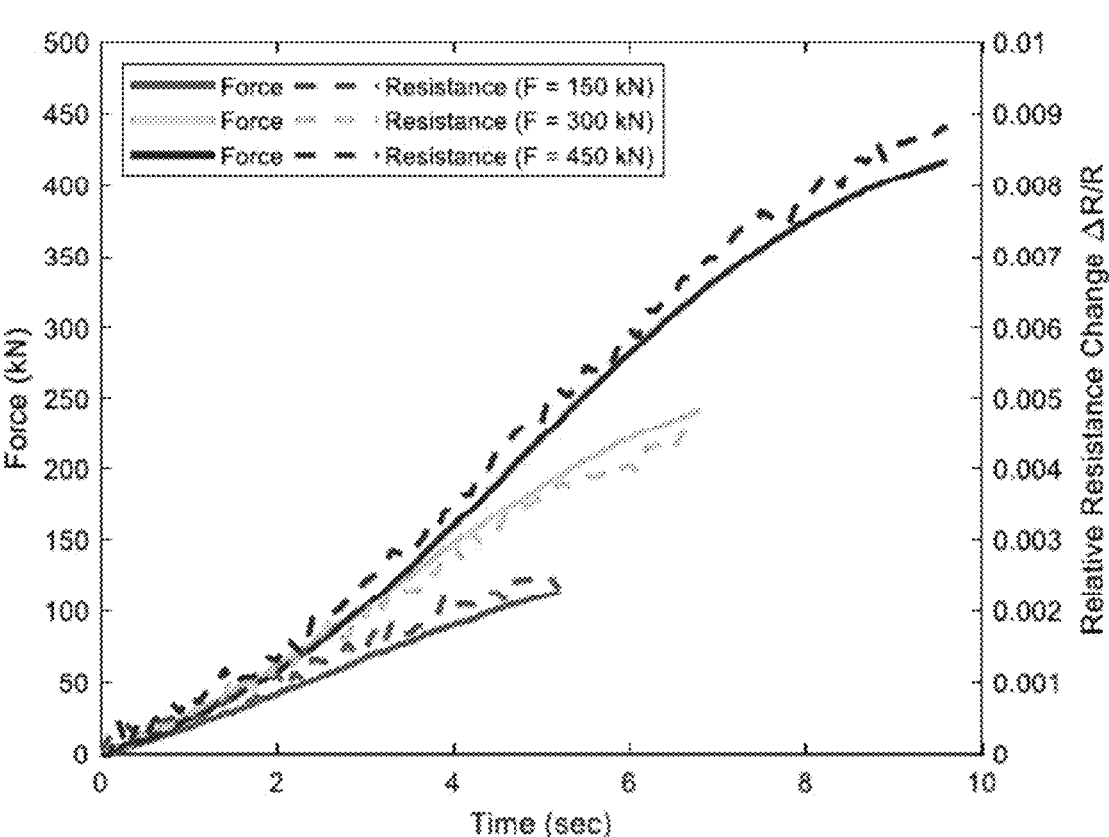
FIGS. 7 to 9 show test results comparing strain magnitude detection performance between a printed strain sensor manufactured according to an exemplary embodiment of the present invention and a conventional vibration sensor.
Figure 8:
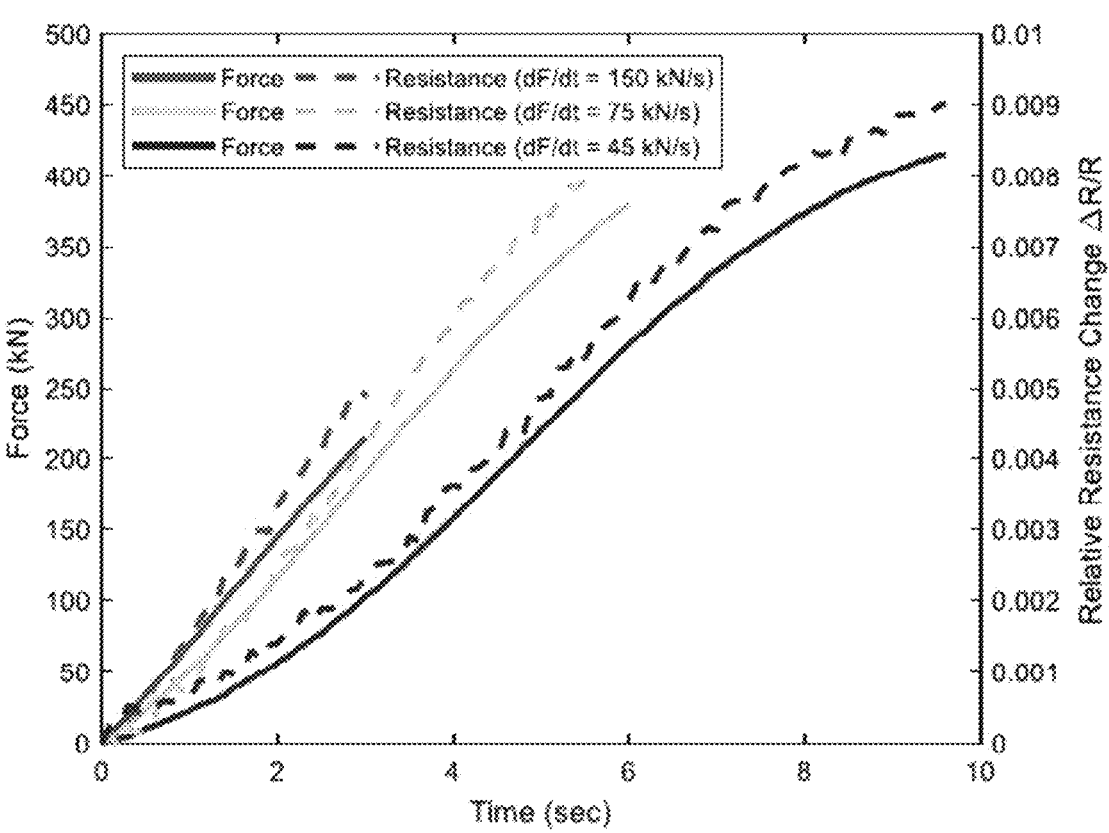
Figure 9:
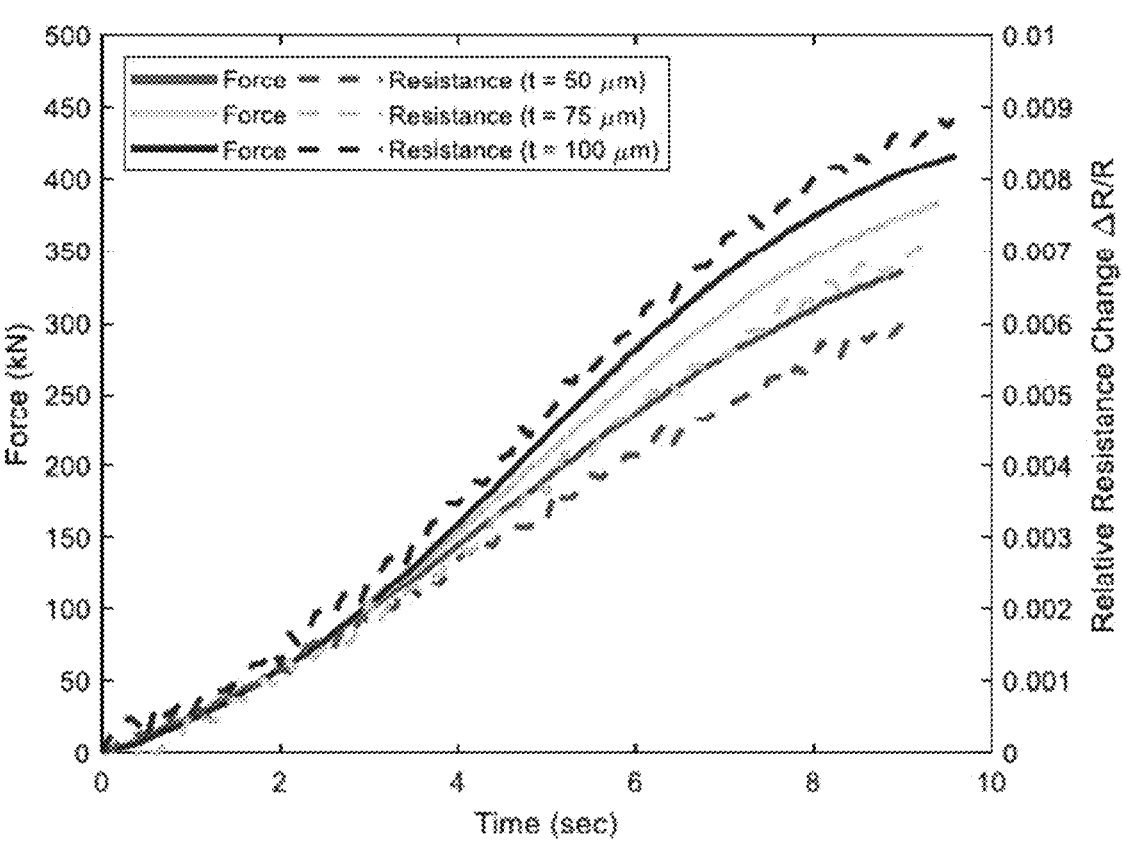

FIGS. 7 to 9 show test results comparing strain magnitude detection performance between the printed strain sensor according to the present invention and a conventional dynamometer.

Referring to FIGS. 7 to 9, FIG. 7 shows the results of measuring the relative change in resistance ΔR/R corresponding to the deformation of the stamper over time with a printed strain sensor and a conventional dynamometer, respectively, when the workpiece is plastically processed while applying various magnitudes of processing forces (F=150 kN, 300 kN, and 450 kN) to the workpiece as illustrated in FIG. 2. FIG. 8 shows the results of measuring the relative change in resistance ΔR/R corresponding to the deformation of the stamper over time with the printed strain sensor and the conventional dynamometer, respectively, when the plastic processing machine plastically processes the workpiece while changing the magnitude of force applied per unit time (dF/dt=45 kN/s, 75 kN/s, and 150 kN/s). FIG. 9 shows the result of measuring the relative change in resistance ΔR/R corresponding to the deformation of the stamper over time with the strain sensor according to the present invention and the conventional dynamometer, respectively, when the plastic processing machine plastically processes the workpiece while changing the thickness of workpiece to be plastic-processed (t=50 μm, 75 μm, and 100 μm). In all three cases, it can be seen that the result detected by the strain sensor (indicated by a solid line) and the result detected by the conventional dynamometer (indicated by a dotted line) show very similar or almost identical trends. These results mean that the strain sensor according to the present invention can be used as a means of measuring power or force of a plastic-processing machine instead of the conventional dynamometer.

Figure 10:
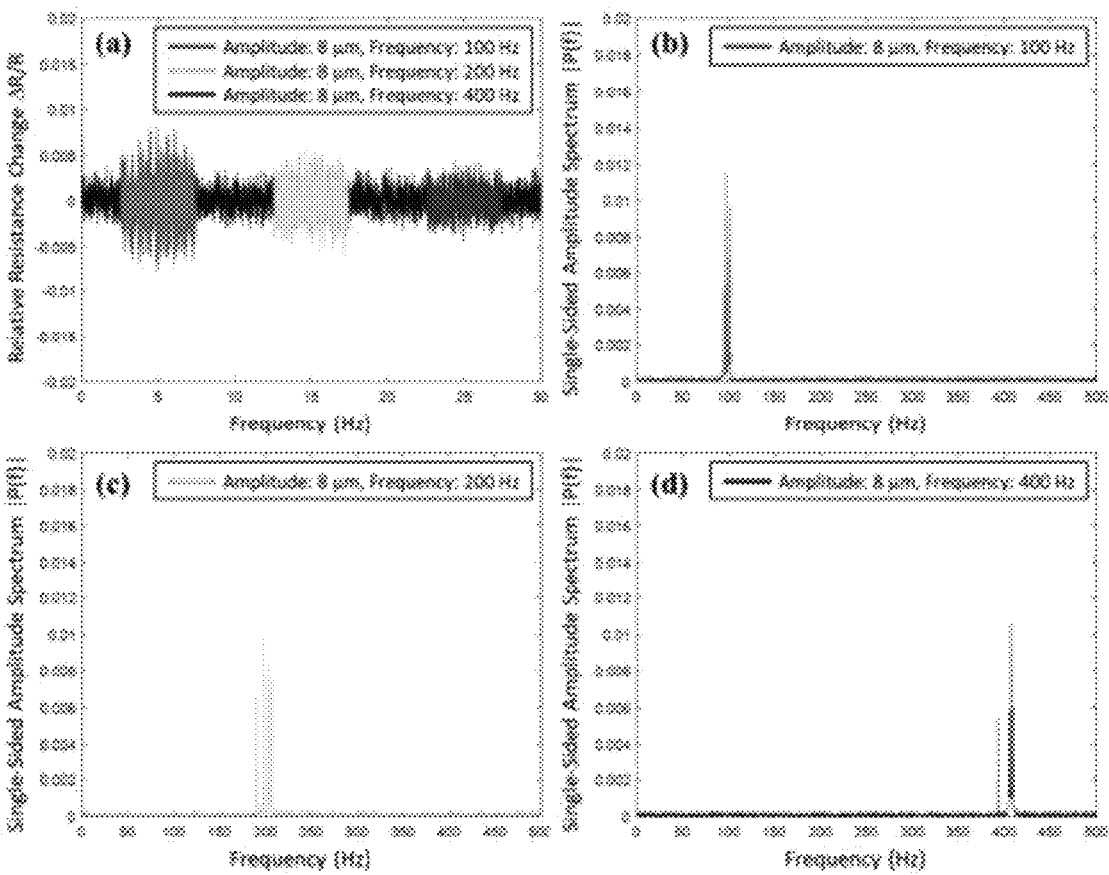
FIGS. 10 and 11 show test results (amplitude spectrum of vibration) for evaluating the vibration measurement performance of the printed strain sensor according to an exemplary embodiment of the present invention.
Figure 11:
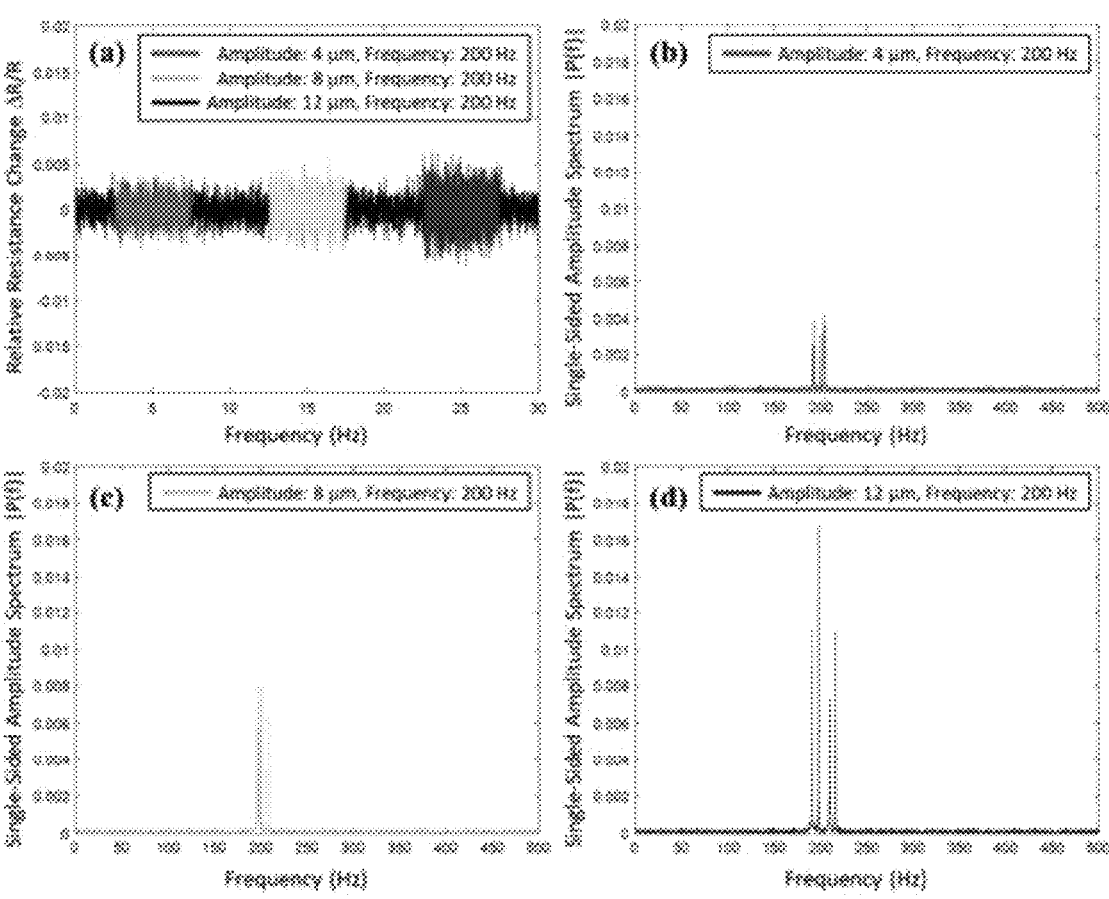

While applying vibration with an amplitude of 8 μm to the workpiece at frequencies of 100 Hz, 200 Hz, and 400 Hz, respectively, the relative change in resistance ΔR/R was measured with the printed strain sensor according to the present invention (see FIG. 10 (*a*)). According to frequency analysis by performing fast Fourier transform (FFT) of the measurement results, it was confirmed that amplitude spectra similar to that of the vibration applied to the workpiece were obtained at each vibration frequencies, 100 Hz, 200 Hz, and 400 Hz (see FIGS. 10 (*b*) to (*d*)). Similarly, as shown in FIG. 11, when vibrations having amplitudes of 4 μm, 8 μm, and 12 μm were applied to the workpiece at a vibration frequency of 200 Hz, respectively, the amplitude spectrum of the vibration measured by the printed strain sensor was proportional to the actual vibration amplitude (see FIGS. 11 (*b*) to (*d*)). These test results showed that the printed strain sensor of the present invention could accurately measure vibrations of several hundred Hz with an amplitude of several to less than twenty of m.

Figure 12:
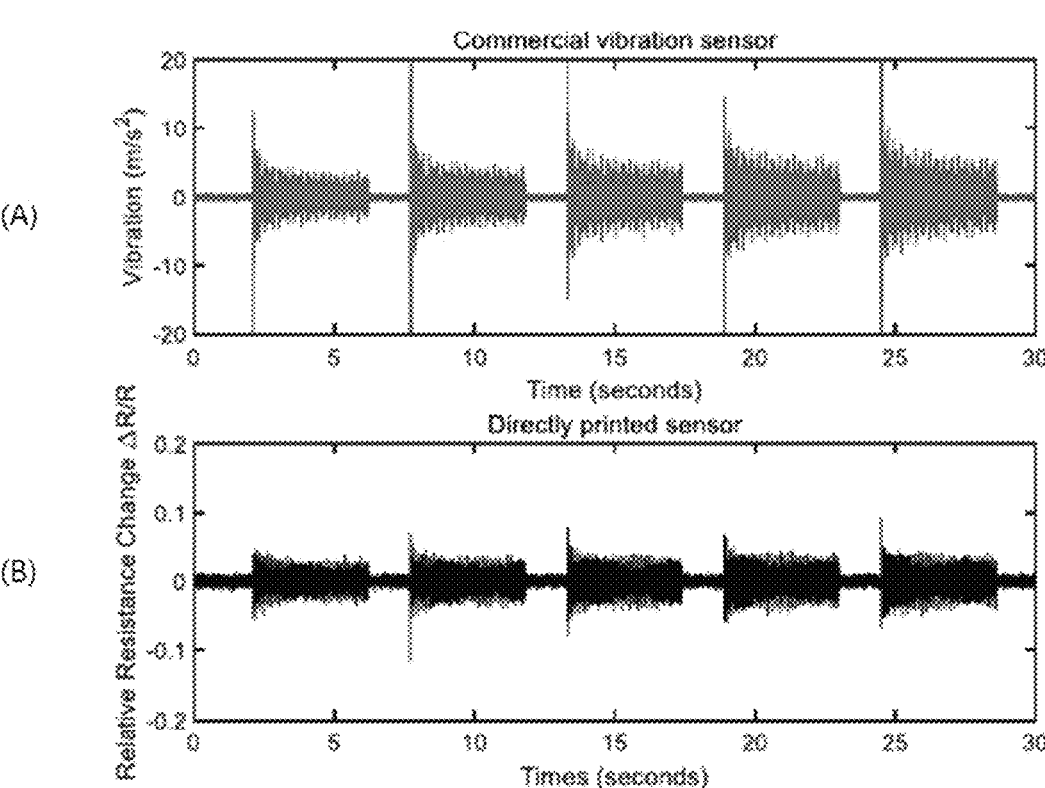
FIGS. 12 to 13 show test results (vibration spectrum of vibration) for comparing the vibration detection performance of the printed strain sensor according to an exemplary embodiment of the present invention and a conventional commercial vibration sensor.
Figure 13:
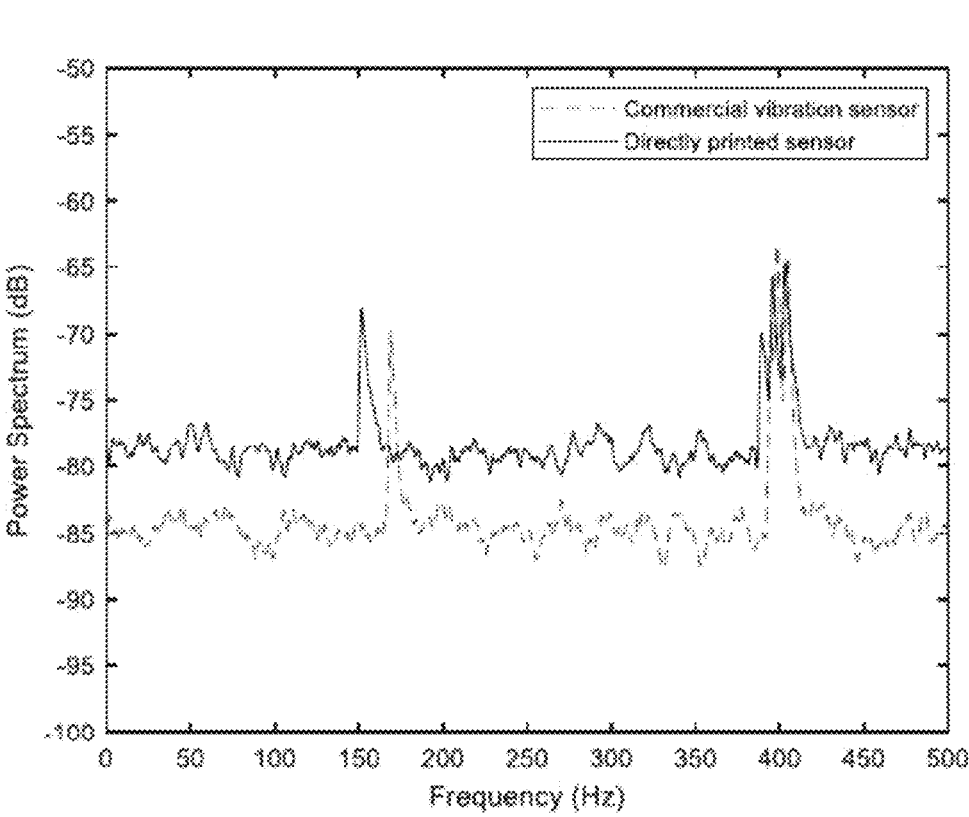

FIGS. 12 and 13 show test results for directly comparing vibration detection performance of the printed strain sensor and the conventional commercial vibration sensor.

In order to investigate the vibration detection performance of the printed strain sensor, the printed strain sensor and the conventional commercial vibration sensor were installed on the workpiece, and the vibration values detected by the printed strain sensor and the commercial vibration sensor were compared during the cutting process. FIGS. 12 (A) and (B) show the vibration results measured by the commercial vibration sensor, and the printed strain sensor, respectively. The graph of (A) shows a pattern substantially similar to that of (B). FIG. 13 shows a power spectrum obtained by Fourier transforming the relative change in resistance ΔR/R measured by the printed strain sensor and the commercial vibration sensor. The power spectra obtained by the two sensors also show a very similar pattern.

Figure 14:
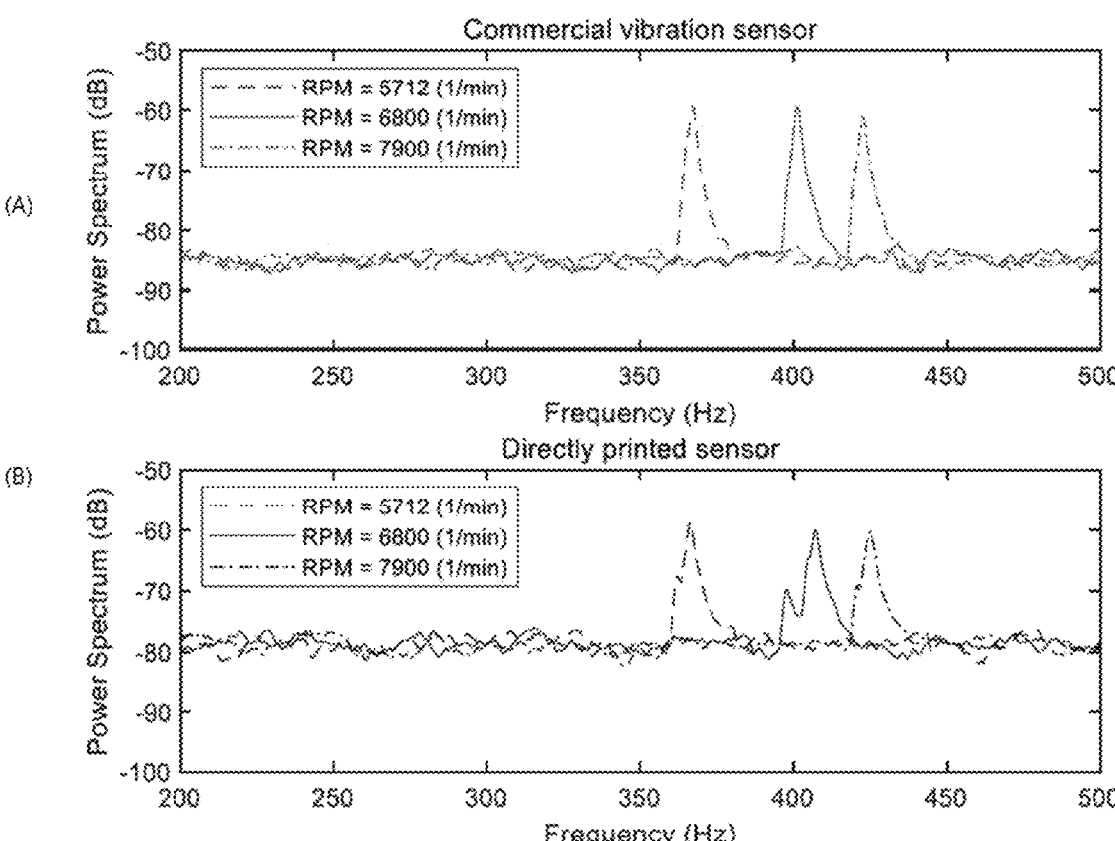
FIG. 14 illustrates test results showing the vibration detection performance of the printed strain sensor according to an exemplary embodiment of the present invention and the conventional commercial vibration sensor when the revolutions per minute (RPM) of a cutting machine is changed to various values.

The graph shown in FIG. 14 is a graph showing a change in power spectrum according to frequency for each RPM when the RPM value of the cutting machine is changed in various values. FIGS. 14 (A) and (B) show results measured by the conventional commercial vibration sensor and the printed strain sensor, respectively. In graphs (A) and (B), the frequency values at which peaks in the frequency spectrum occur are similar. The tendency of vibration measured by the printed strain sensor and the tendency of vibration measured by the conventional commercial vibration sensor are substantially the same. Even if the RPM value is changed, it can be seen that the printed strain sensor and the conventional commercial vibration sensor show substantially the same measurement results.

Figure 15:
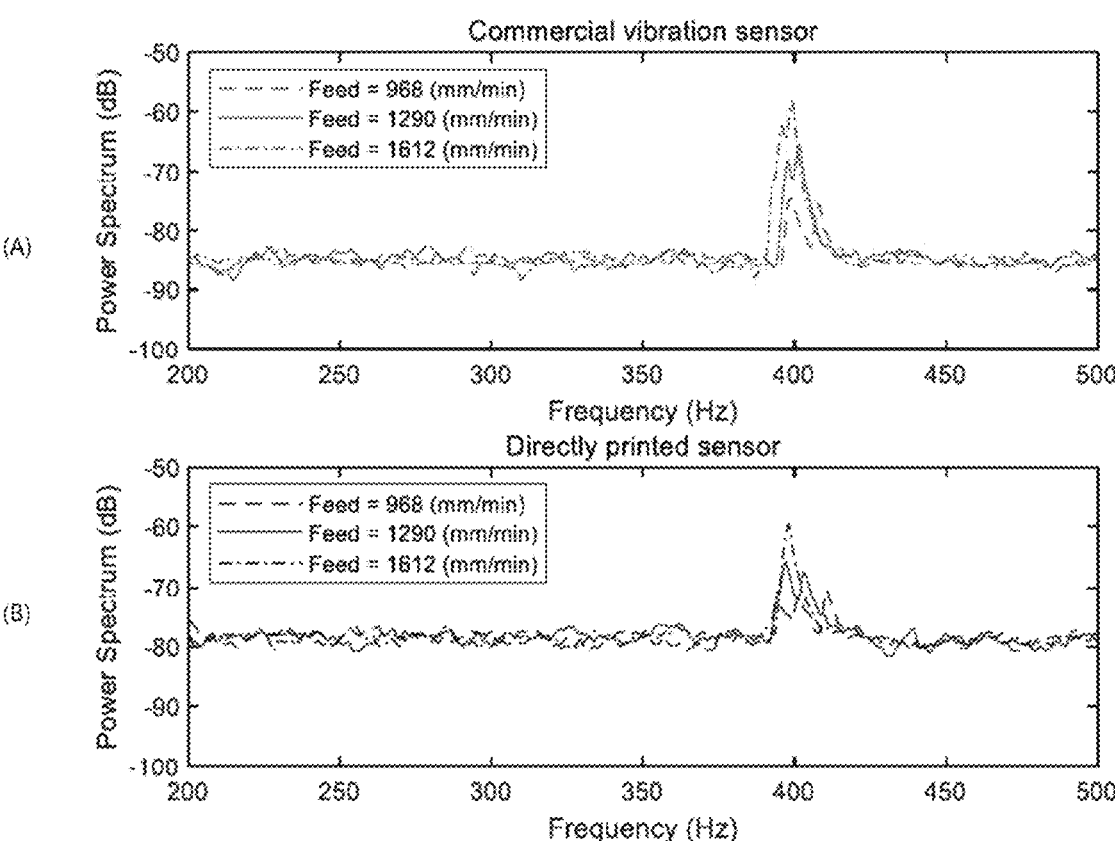
FIG. 15 illustrates test results showing the vibration detection performance of the printed strain sensor according to an exemplary embodiment of the present invention and the conventional commercial vibration sensor when the feed rate of the cutting machine is changed to various values.

The graphs shown in FIG. 15 illustrate a change in power spectrum according to frequency when a feed rate is changed. Here, the feed rate means the speed of relative linear movement between the cutting machine and the workpiece. FIGS. 15 (A) and (B) are results measured by the conventional commercial vibration sensor, and the printed strain sensor, respectively. Even at various feed rate values, it can be seen that the printed strain sensor and the conventional commercial vibration sensor show substantially the same measurement results.

Figure 16:
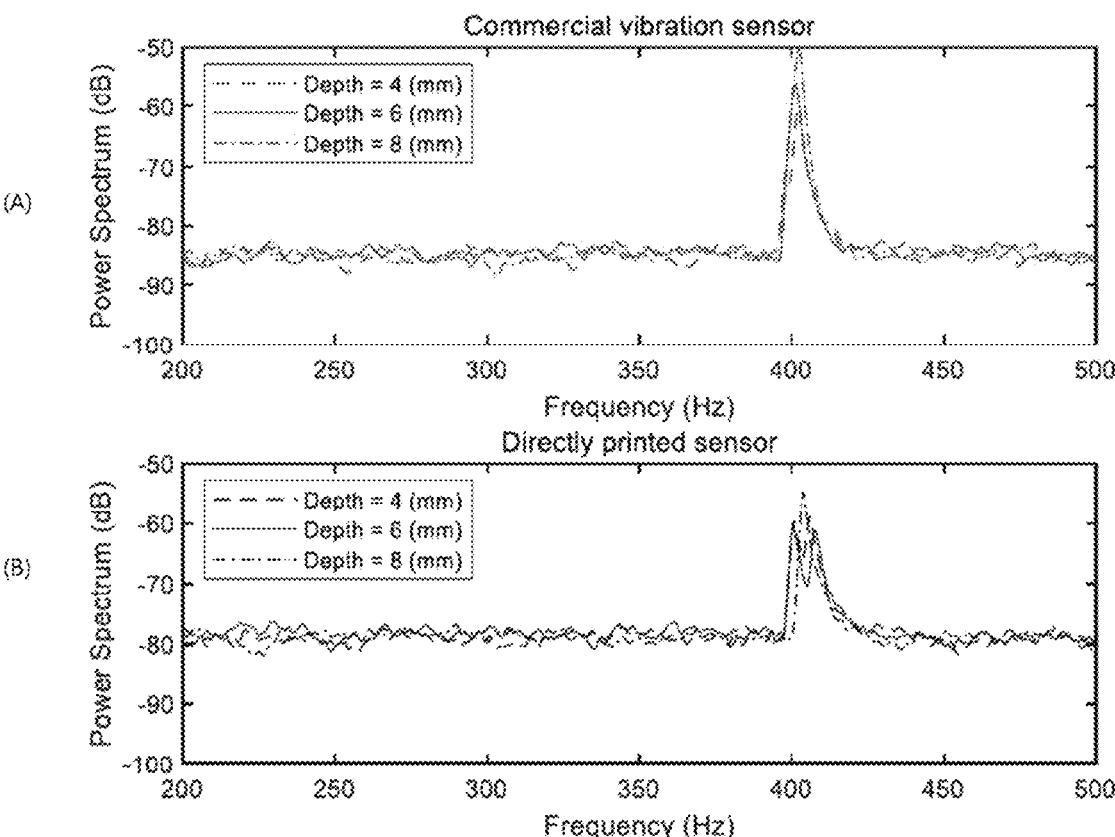
FIG. 16 illustrates test results showing the vibration detection performance of the printed strain sensor according to an exemplary embodiment of the present invention and the conventional commercial vibration sensor when the cutting depth is changed to various values.

The graph shown in FIG. 16 illustrates a change in power spectrum according to frequency when the cutting depth is changed to various values. Here, the cutting depth means the depth at which the cutting machine cuts the inside of the workpiece in a vertical direction at once. FIGS. 16 (A) and (B) are results measured by the conventional commercial vibration sensor, and the printed strain sensor, respectively. Even at various cutting depths, it can be seen that the printed strain sensor and the conventional commercial vibration sensor show substantially the same measurement results.

Figure 17:
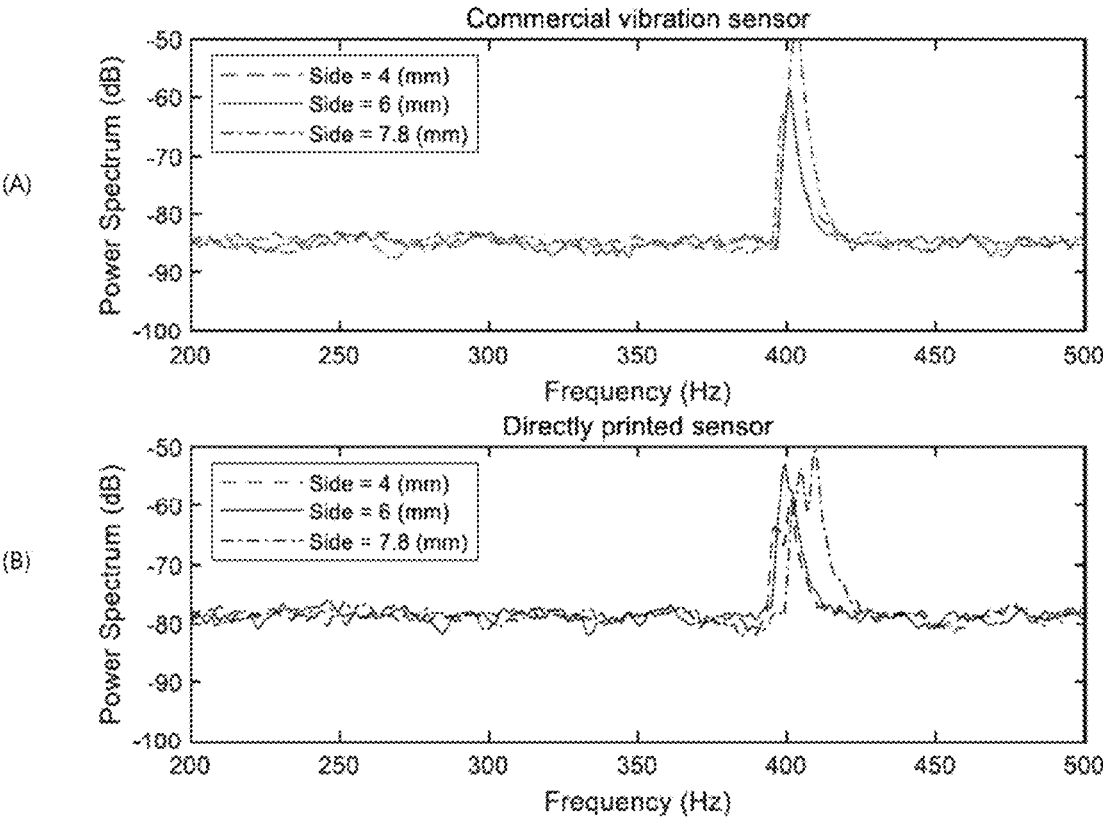
FIG. 17 illustrates test results showing the vibration detection performance of the printed strain sensor according to an exemplary embodiment of the present invention and the conventional commercial vibration sensor when the side cutting depth for cutting crops laterally is changed to various values.

The graph shown in FIG. 17 shows the change of the power spectrum according to the frequency when the lateral cutting depth (cutting side) in which the workpiece is cut laterally is changed to various values. FIGS. 17 (A) and (B) are results measured by the conventional commercial vibration sensor, and the printed strain sensor, respectively. Even at various lateral cutting depths, it can be seen that the printed strain sensor and the conventional commercial vibration sensor show substantially the same measurement results.

Various test results shown in FIGS. 10 to 17 show that the printed strain sensor according to the present invention has sufficient and excellent performance to be used as a means for measuring vibration during a cutting process of a workpiece in place of the conventional commercial vibration sensor.

Meanwhile, FIG. 18 is a flowchart illustrating an algorithm of a method for monitoring strain and/or vibration generated when machining a workpiece according to an exemplary embodiment.

As mentioned above, the deformation or vibration of the object to be measured over time can be converted into a resistance value over time of the printed strain sensor according to the present invention. Depending on how the resistance value information is processed, information on the strain and the force that caused the strain can be obtained, or information on the magnitude of the vibration can be obtained.

First, referring to FIG. 1, a method of monitoring vibration generated during a workpiece is machined will be described.

In order to measure the vibration generated in the workpiece 20 through the strain sensors 40*x*, 40*y*, and 40*z*, first the strain sensors 40*x*, 40*y*, and 40*z* are attached to the surface of the workpiece 20 one by one for each desired vibration direction, and the strain sensors 40*x*, 40*y*, and 40*z* are connected to the resistance measuring unit 120 as illustrated in FIG. 1 (step S10). The strain sensors 40*x*, 40*y*, and 40*z* can be easily attached to the object to be measured because the conductive line pattern may be printed on the adhesive and flexible substrate, and can be easily attached even when the surface of the object to be measured is a free curved surface.

The milling cutting machine 30 may rotate the cutting blade 32 at high speed to perform a cutting process in which a hole is drilled in the workpiece 20 or a specific surface is cut. At this time, the cutting blade 32 cuts while hitting the workpiece 20, and vibration is generated in the workpiece 20 due to the impact. Such vibrations may cause deformation of the strain sensors 40*x*, 40*y*, and 40*z*, to be slightly deformed. The deformation of each of strain sensor 40*x*, 40*y*, and 40*z* causes a change in the resistance value of the corresponding strain sensor. During the cutting process, the resistance measuring unit 120 may measure the resistance value over time of each strain sensor 40*x*, 40*y*, and 40*z* (step S20).

The resistance measuring unit 120 may quantize the measured change in resistance value according to a measured time, that is, the relative change in resistance ΔR/R, to be outputted as a digital value to the signal processing unit 130. The signal processing unit 130 may perform a Fourier transform on the measured resistance value, which is data in the time domain, to be converted into data in the frequency domain (step S30).

The data of Fourier-transformed resistance value may be expressed as a sum of periodic functions having various frequencies. The Fourier-transformed data in the frequency domain may be provided to the operation processing unit 140. The operation processing unit 140 may obtain the power spectrum of the Fourier-transformed periodic signals in the frequency domain (step S40).

The power spectrum represents the intensity of power with respect to frequency. The operation processing unit 140 may find a power peak in the power spectrum and output it as the magnitude of vibration generated during machining of the workpiece. In detecting a power peak point in the power spectrum, the operation processing unit 140, as described above, may be configured to detect a power peak within a frequency band of 100 Hz to 2 KHz corresponding to a vibration frequency band generated in the workpiece 20 by cutting-off or cutting the workpiece 20. In addition, the frequency band where the power peak occurs corresponds to the vibration frequency. The operation processing unit 140 may output the power peak and the corresponding frequency band as the magnitude and the frequency of the vibration (step S50).

If the vibration is detected in a plurality of directions, the operation processing unit 140 may calculate the synthesized vibration by synthesizing vibration magnitudes for respective vibration directions (step S60).

The operation processing unit 140 may calculate the magnitude of the vibration in real time and output it in a form that can be recognized by the user through the output unit 150.

Next, a method of measuring in real time the strain occurring in the stamper and the corresponding plastic machining force when the plastic processing machine plastically processes the workpiece will be described.

First, as shown in FIGS. 2A and 2B, the strain sensor 90 may be attached to the stamper 82 of the plastic processing machine 80. The strain sensor 90 may be connected to the resistance measuring unit 120 (step S15).

In this state, when the plastic processing machine 80 plastically processes the workpiece 70 by applying force Fx through the stamper 82 (see FIG. 2A), the workpiece 70 is plastically processed while being pressed between the die 60 and the stamper 82. If the stamper 82 continues to apply the force Fx in the normal direction of the die 60 until plastic working is completed, the stamper 82 and the die 60 may be stretched in a planar direction (horizontal direction in the drawing). At this time, the resistance value of the strain sensor 90 changes as the strain sensor 90 is also stretched in the plane direction by the amount dy by which the stamper 82 is deformed in the planar direction. The resistance measuring unit 120 may measure the changed resistance value of the strain sensor 90 over time (step S20).

The second signal processing unit 134 may receive the resistance value data measured by the resistance measuring unit 120 and perform low-pass filtering (step S70). This is to filter out high-frequency noise included in the resistance value data. The filtered resistance value data may be provided to the operation processing unit 140.

The operation processing unit 140 may calculate the magnitude of the strain ε by applying the provided resistance value data to the gauge factor $(G_f)$ equation, $G_f \cdot (\Delta R/R)$ e, as in Equation (1) mentioned above (step S80).

The magnitude of the strain (F) has a corresponding relationship with the magnitude of the force Fx applied to the stamper 82 by the plastic processing machine 80. Data on the corresponding relationship can be obtained in advance through testing. The operation processing unit 140 may obtain the magnitude of the force Fx applied by the plastic processing machine 80 corresponding to the calculated strain based on the mapping data between the magnitude of the strain ε and the force Fx of the plastic processing machine 80 (step S90). The operation processing unit 140 may output the magnitude of the obtained strain ε and the magnitude of the force Fx of the plastic processing machine 80 through the output unit 150 so that the operator can monitor the plastic working state.

In this way, when appropriate post-processing is performed using the measured resistance value of the strain sensor 90, the magnitude of the strain applied to the stamper during plastic processing and the magnitude of plastic processing force Fx, and/or the magnitude of vibration generated in the workpiece during cutting machining may be measured and outputted in real time. Through this, the user may monitor the machining status and process of the workpiece during plastic processing and cutting machining.

INDUSTRIAL APPLICABILITY

As the smartization of the manufacturing industry such as smart factory continues, the present invention can be used for various molding processes such as milling of workpieces, rubber molding processes, various cutting processes including grinding and rough grinding, and embossing and hydroforming processes.

Although the embodiments have been described with limited drawings as above, specific structural or functional descriptions of the embodiments of the present invention disclosed herein are illustrated only for the purpose of describing the embodiment of the present invention. The embodiments of the present invention may be implemented in various forms, and should not be construed as being limited to the embodiments described herein. However, this is not intended to limit the present invention to a particular form of disclosure, and should be understood to include all modifications, equivalents, or substitutes included within the spirit and scope of the present invention. Those skilled in the art will understand that various modifications and changes of the present invention can be made without departing from the spirit and scope of the present invention recited in the claims below. Therefore, other implementations, other embodiments, and those equivalents to the claims are within the scope of the following claims.

What is claimed is:

1. A system for monitoring workpiece processing based on strain sensor, comprising:

a strain sensor unit including one or more strain sensors attached to a workpiece;

a resistance measuring unit configured to measure a resistance value of each of the one or more strain sensors;

a signal processing unit configured to obtain a power spectrum in a frequency domain by Fourier transforming the resistance value signal measured by the resistance measuring unit, and an operation processing unit configured to find a power peak in the power spectrum to be provided as a magnitude of vibration generated during machining of the workpiece.

2. The system of claim 1, wherein the resistance measuring unit is configured to measure resistance values of the one or more strain sensors, the signal processing unit being configured to perform Fourier transform on each of the plurality of resistance values measured by the resistance measuring unit to obtain a plurality of power spectra in the frequency domain, and the operation processing unit being configured to find the power peak in each of the plurality of power spectra and obtain a corresponding magnitude of vibration in each direction.

3. The system of claim 1, wherein the strain sensor unit further comprises a strain sensor attached to a stamper mounted on a plastic processing machine, the resistance measuring unit being configured to measure a resistance value of the strain sensor attached to the stamper mounted on the plastic processing machine, the signal processing unit being configured to perform low-pass filtering on a measured resistance value signal and convert the filtered signal into a digital value, and the operation processing unit being configured to calculate a magnitude of strain corresponding to the converted resistance value.

4. The system of claim 3, wherein the operation processing unit is configured to calculate the magnitude of strain by applying the converted resistance value to a gauge factor equation, $G_f=(\Delta R/R)\varepsilon$, where $G_f$ is a gauge factor value of the strain sensor, and R is an initial resistance value of the strain sensor, $\Delta R$ is an amount of change in the resistance value of the strain sensor, and $\varepsilon$ is a magnitude of a strain to be obtained.

5. The system of claim 3, wherein the operation processing unit is configured to obtain a magnitude of force applied by the plastic processing machine corresponding to the obtained magnitude of strain.

6. The system of claim 1, wherein the operation processing unit is configured to detect the power peak within a frequency range of 100 Hz-2 KHz of the power spectrum.

7. The system of claim 1, wherein the strain sensor has a sensitivity that a gauge factor is 10 or more and a vibration measurement rate is 100 Hz or more.

8. The system of claim 1, wherein the strain sensor includes a flexible adhesive substrate; and a conductive line pattern directly printed on a surface of the substrate with conductive fine particles or a composite nanomaterial mixture in which conductive fine particles and carbon nanotubes are mixed, and wherein the conductive line pattern is configured to be changed in the resistance value by being deformed according to deformation of the substrate.

9. The system of claim 8, wherein a mixing ratio of the conductive fine particles and the carbon nanotubes of the conductive line pattern formed of the composite nanomaterial mixture is in a range of 60% by weight to 40% by weight to 90% by weight to 10% by weight.

10. A method of monitoring workpiece processing based on strain sensor, including:
  attaching one or more strain sensors connected to a resistance measuring unit to a workpiece;
  measuring resistance values of the one or more strain sensors using the resistance measuring unit while machining the workpiece with a machine tool;
  obtaining a power spectrum in a frequency domain by Fourier transforming a resistance signal measured over time; and detecting a power peak in the power spectrum to be outputted as a magnitude of vibration generated during machining of the workpiece.

11. The method of claim 10, wherein the power peak is detected within a frequency range of 100 Hz-2 KHz of the power spectrum.

12. The method of claim 10, wherein the one or more strain sensors have a sensitivity that a gauge factor is 10 or more and a vibration measurement rate is 100 Hz or more.

13. The method of claim 10, wherein each of the one or more strain sensors is configured to include a conductive line pattern in which nanoparticles are directly printed on a surface of a flexible adhesive substrate, and the conductive line pattern is deformed by deformation of the workpiece during machining the workpiece so that a resistance value of the conductive line is changed.

14. The method of claim 10, further including attaching a strain sensor connected to the resistance measuring unit to a stamper mounted on a plastic processing machine; measuring a resistance value of the strain sensor using the resistance measuring unit while plastically processing a workpiece by pressing the workpiece placed on a die with the stamper of the plastic processing machine; and calculating a magnitude of strain corresponding to the measured resistance value.

15. The method of claim 14, wherein the calculating further include performing low-pass filtering on the measured resistance value; and calculating the magnitude of strain by applying the filtered resistance value to a gauge factor equation, $G_f=(\Delta R/R)\varepsilon$, where $G_f$ is a gauge factor value of the strain sensor, and R is an initial resistance value of the strain sensor, $\Delta R$ is an amount of change in the resistance value of the strain sensor, and $\varepsilon$ is a magnitude of a strain to be obtained.

16. The method of claim 14, further including calculating a magnitude of force applied by the plastic processing machine corresponding to the calculated magnitude of strain.

17. A method of monitoring workpiece processing based on a strain sensor, including:
  attaching one or more strain sensors connected to a resistance measuring unit to a workpiece;
  measuring resistance values of the one or more strain sensors with time while cutting the workpiece using a milling cutting machine;
  Fourier-transforming the resistance value measured with time for each of the one or more strain sensors into a power spectrum a frequency domain;
  detecting a power peak in the power spectrum and a frequency band in which the power peak occurs in the power spectrum for each of the one or more strain sensors; and
  outputting the detected power peak and frequency band as information on the magnitude and frequency of vibration generated in the workpiece during cutting the workpiece.

18. The method of claim 17, wherein the power peak is detected within a frequency range of 100 Hz-2 KHz of the power spectrum.

19. The method of claim 17, wherein the one or more strain sensors have a sensitivity that a gauge factor is 10 or more and a vibration measurement rate is 100 Hz or more.

20. A method of using a strain sensor having a sensitivity that a gauge factor is 10 or more and a vibration measurement rate is 100 Hz or more, to measure a magnitude of vibration generated when a workpiece is machined with a machine by attaching the strain sensor.

21. The method of claim 20, wherein the strain sensor has a characteristic capable of measuring vibration having a frequency of 100 Hz to 2 KHz.

* * * * *